(12) United States Patent
Higashino et al.

(10) Patent No.: US 9,006,036 B2
(45) Date of Patent: Apr. 14, 2015

(54) METHOD OF MANUFACTURING SEMICONDUCTOR DEVICE

(71) Applicant: Renesas Electronics Corporation, Kawasaki-shi, Kanagawa (JP)

(72) Inventors: Tomoko Higashino, Kanagawa (JP); Yuichi Morinaga, Kanagawa (JP); Kazuya Tsuboi, Kanagawa (JP); Tamaki Wada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/030,973

(22) Filed: Sep. 18, 2013

(65) Prior Publication Data

US 2014/0080260 A1    Mar. 20, 2014

(30) Foreign Application Priority Data

Sep. 19, 2012 (JP) ................ 2012-205174

(51) Int. Cl.
*H01L 21/56* (2006.01)
*H01L 23/00* (2006.01)
*H01L 23/498* (2006.01)
(Continued)

(52) U.S. Cl.
CPC .............. *H01L 21/565* (2013.01); *H01L 24/27* (2013.01); *H01L 24/743* (2013.01); *H01L 2224/32225* (2013.01); *H01L 2224/48091* (2013.01); *H01L 2224/48227* (2013.01); *H01L 2224/73265* (2013.01); *H01L 2224/83192* (2013.01); *H01L 2224/92247* (2013.01); *H01L 23/15* (2013.01); H01L 23/49838 (2013.01); *H01L 23/4985* (2013.01); *H01L 25/0655* (2013.01); *H01L 2224/45144* (2013.01); *H01L 24/45* (2013.01); *H01L 2224/45147* (2013.01); *H01L 2224/48228* (2013.01); *H01L 2224/48465* (2013.01); *H01L 2224/49171* (2013.01); *H01L 2924/15311* (2013.01); *H01L 24/48* (2013.01);
(Continued)

(58) Field of Classification Search
CPC ....... H01L 23/04; H01L 23/495; H01L 23/48; H01L 23/52; H01L 23/29
USPC ......... 257/622, 629, 672, 676, 730, 773, 778; 438/118, 464, 457, 127
See application file for complete search history.

(56) References Cited

U.S. PATENT DOCUMENTS

2004/0056337 A1* 3/2004 Hasebe et al. ................ 257/667
2008/0225491 A1* 9/2008 Martinez et al. ............. 361/709
2008/0237810 A1* 10/2008 Subramanian et al. ....... 257/629

FOREIGN PATENT DOCUMENTS

| JP | H6-37122 A | 2/1994 |
| JP | H7-45641 A | 2/1995 |
| JP | 2002-050642 A | 2/2002 |

*Primary Examiner* — Mark A. Laurenzi, III
*Assistant Examiner* — Brian Turner
(74) *Attorney, Agent, or Firm* — McDermott Will & Emery LLP

(57) ABSTRACT

To provide a semiconductor device having an improved quality. The semiconductor device of the invention has a tape substrate having a semiconductor chip thereon, a plurality of land pads placed around the semiconductor chip, a plurality of wires for electrically coupling the electrode pad of the semiconductor chip to the land pad, and a plurality of terminal portions provided on the lower surface of the tape substrate. An average distance between local peaks of the surface roughness of a first region between the land pad of the tape substrate and the semiconductor chip is smaller than an average distance of local peaks of the surface roughness of a second region between the land pad of the tape substrate and the first region.

14 Claims, 22 Drawing Sheets

(51) Int. Cl.
*G06K 19/077* (2006.01)
*H01L 23/15* (2006.01)
*H01L 25/065* (2006.01)

(52) U.S. Cl.
CPC .................. *H01L2224/83194* (2013.01); *H01L 2224/29034* (2013.01); *H01L 24/29* (2013.01); *H01L 24/49* (2013.01); *H01L 24/83* (2013.01); H01L 24/97 (2013.01); *H01L 2224/05553* (2013.01); *H01L 2224/27013* (2013.01); *H01L 2224/2919* (2013.01); *H01L 2224/743* (2013.01); *H01L 2224/83862* (2013.01); *H01L 2924/10253* (2013.01); H01L 23/49855 (2013.01); G06K 19/07747 (2013.01)

METHOD OF MANUFACTURING SEMICONDUCTOR DEVICE

CROSS-REFERENCE TO RELATED APPLICATIONS

The disclosure of Japanese Patent Application No. 2012-205174 filed on Sep. 19, 2012 including the specification, drawings and abstract is incorporated herein by reference in its entirety.

BACKGROUND

The present invention relates to a manufacturing technology of a semiconductor device, for example, a technology effective when applied to a semiconductor device obtained by wire bonding to leads of a substrate.

A substrate-type semiconductor device having, as a means for preventing flow-out of an adhesive, a spot-facing groove formed in a substrate at the periphery of a die pad is disclosed, for example, in Japanese Patent Laid-Open No. Hei 7(1995)-45641 (Patent Document 1).

Further, a structure in which a semiconductor chip or another electronic component element is fixed to a printed wiring board and a groove portion is provided by laser processing between a die pad portion and a bonding pad portion for electrically coupling the electronic component element is disclosed, for example, in Japanese Patent Laid-Open No. 2002-50642 (Patent Document 2).

Still further, a leadframe-type semiconductor device having a structure provided, at the header thereof to which a pellet (semiconductor chip) is coupled via a solder layer, with a step difference and a small groove for preventing the flow of a solder is disclosed, for example, in Japanese Patent Laid-Open No. Hei 6(1994)-37122 (Patent Document 3).

[Patent Document 1] Japanese Patent Laid-Open No. Hei 7 (1995)-45641

[Patent Document 2] Japanese Patent Laid-Open No. 2002-50642

[Patent Document 3] Japanese Patent Laid-Open No. Hei 6(1994)-37122

SUMMARY

In a die bonding step for fabricating a semiconductor device (semiconductor package) having a semiconductor chip mounted on a wiring board, a die bond material is applied to a chip mounting region of the wiring board, placing the semiconductor chip on the die bond material, and then heat treating (cure baking) and thereby curing the die bond material.

During this heat treatment, there occurs a phenomenon, so-called "bleeding", wherein due to a decrease in the viscosity of the die bond material, the die bond material is separated into a high molecular component and a low molecular component and the low molecular component spatters. When this bleeding phenomenon occurs on the wiring board, mainly the low molecular component in the die bond material oozes out on the wiring board. If the die bond material has, in the vicinity thereof, a land pad (land, electrode, or lead) for wire bonding, the low molecular component of the die bond material oozes out, attaches to the surface of the land pad, and stains the land pad. As a result, during bonding a wire to the land pad in a wire bonding step, there is a possibility of bonding failures such as failure in coupling the wire to the land pad thus stained and if the wire can be coupled, easy separation of the wire from the land pad.

Among substrate-type semiconductor devices, particularly semiconductor devices typified by IC (integrated circuit) card and the like are limited in their height and the like so that a thin-film tape substrate is often used as a wiring board and its fabrication tends to be conducted in a consistent hoop line. In the fabrication using the hoop line, however, when conveyance troubles or the like occur, works (products) are not transferred smoothly and inevitably stayed in a cure furnace. At this time, the above-mentioned bleeding phenomenon tends to occur.

In addition, the external size of semiconductor devices such as IC card is standardized so that it cannot be changed freely. Due to such a limitation, when a large semiconductor chip is mounted on a tape substrate, a die bond material applied to the bottom of the chip comes close to a land pad placed at the periphery of the chip. As a result, the bleed is likely to encroach even on the land pad and the above-mentioned bonding failures occur with high probability.

The structures disclosed above in Patent Documents 1 and 2 are for preventing a die bond material itself from flowing out and attaching to a land pad for wire bonding but not for preventing the bleed from oozing out and encroaching on the land pad. Even using the technologies disclosed in Patent Documents 1 and 2 therefore cannot solve the bonding failures caused by ooze of the bleed.

An object of the embodiments disclosed herein is to provide a technology capable of manufacturing a semiconductor device having improved quality.

Other problems and novel features of the invention will be apparent from the description herein and accompanying drawings.

A method of manufacturing a semiconductor device according to First Embodiment includes a step of mounting a semiconductor chip on the main surface of a wiring board via an adhesive material and a step of curing the adhesive material at a temperature higher than the normal temperature. In this method, an average distance between local peaks of the surface roughness of a first region between a land pad of a wiring board and a semiconductor chip is made smaller than an average distance between local peaks of the surface roughness of a second region between the land pad of a wiring board and the first region.

According to First Embodiment, for example, a semiconductor device having improved quality can be obtained.

DETAILED DESCRIPTION

Figure 1:
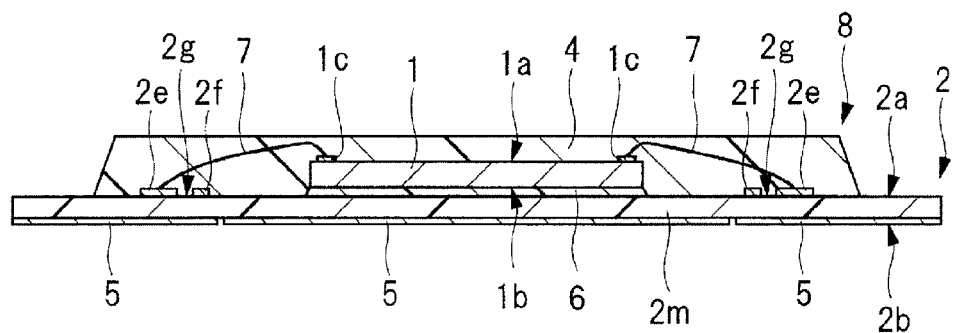
FIG. 1 is a cross-sectional view showing an example of the structure of a semiconductor device according to the embodiment.

In the following embodiments, a repeated description of the same or like parts will be omitted in principle unless particularly necessary.

In the following embodiments, a description will be made after divided in a plurality of sections or in a plurality of embodiments if necessary for convenience's sake. These sections or embodiments are not independent from each other, but in a relation such that one is a modification example, details or complementary description of a part or whole of the other one unless otherwise specifically indicated.

In the following embodiments, when a reference is made to the number of elements (including the number, value, amount, and range), the number is not limited to a specific number but may be greater than or less than the specific number unless otherwise specifically indicated or principally apparent that the number is limited to the specific number.

Moreover, in the following embodiments, it is needless to say that the constituent components (including elemental steps) are not always essential unless otherwise specifically indicated or principally apparent that the element is essential.

In the following embodiments, when the term "comprising A", "being comprised of A", "having A", or "containing A" is cited with regards to a constituent component or the like, it is needless to say that it does not exclude a component other than the constituent component unless otherwise particularly specified that it is limited to the specific component. Similarly, in the following embodiments, when a reference is made to the shape, positional relationship, or the like of the constituent components, that substantially approximate or similar to it is also embraced unless otherwise specifically indicated or principally apparent that it is not. This also applies to the above-described value, range, and the like.

Embodiments will hereinafter be described in detail based on drawings. In all the drawings for describing the embodiment, members of a like function will be identified by like reference numerals in principle and overlapping descriptions will be omitted. To facilitate understanding of the drawings, even a plan view may be hatched.

Embodiment

Figure 2:
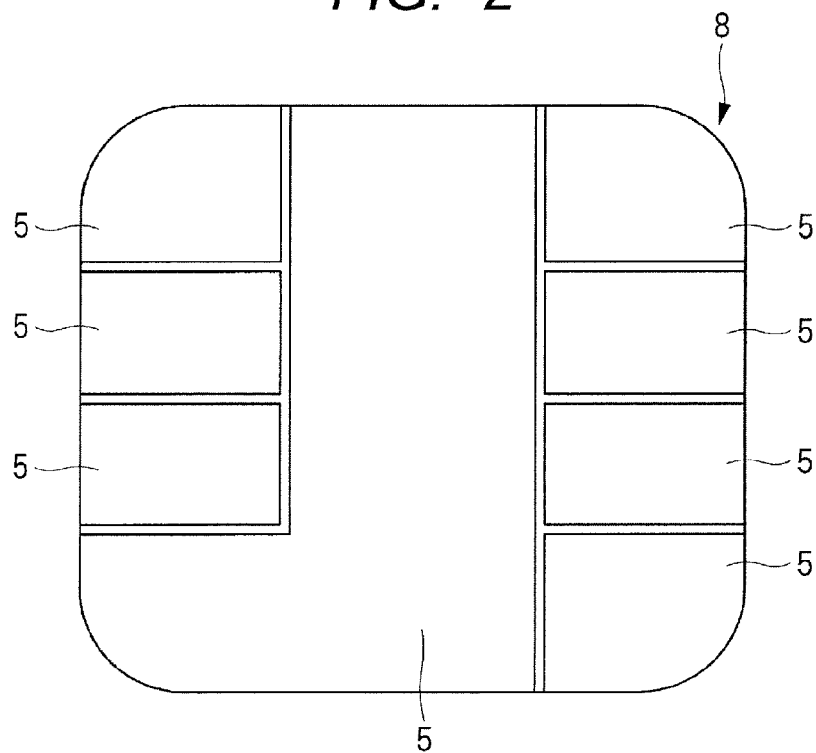
FIG. 2 is a back view showing an example of the arrangement of external terminals on the back surface side of the semiconductor device of FIG. 1.
Figure 3:
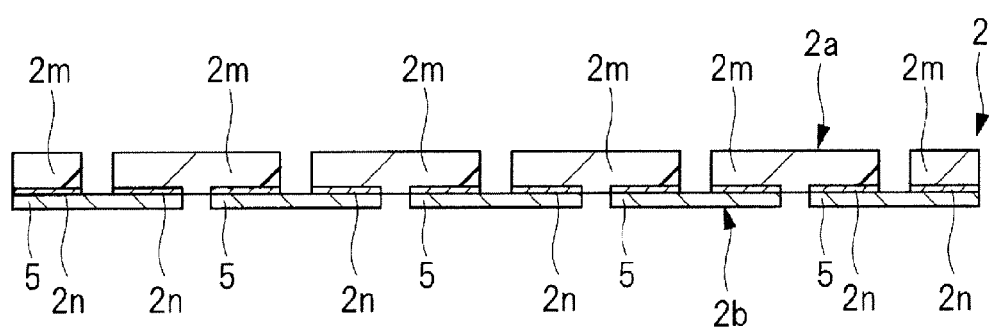
FIG. 3 is a cross-sectional view showing an example of the structure of a tape substrate to be used in the semiconductor device of FIG. 1.
Figure 4:
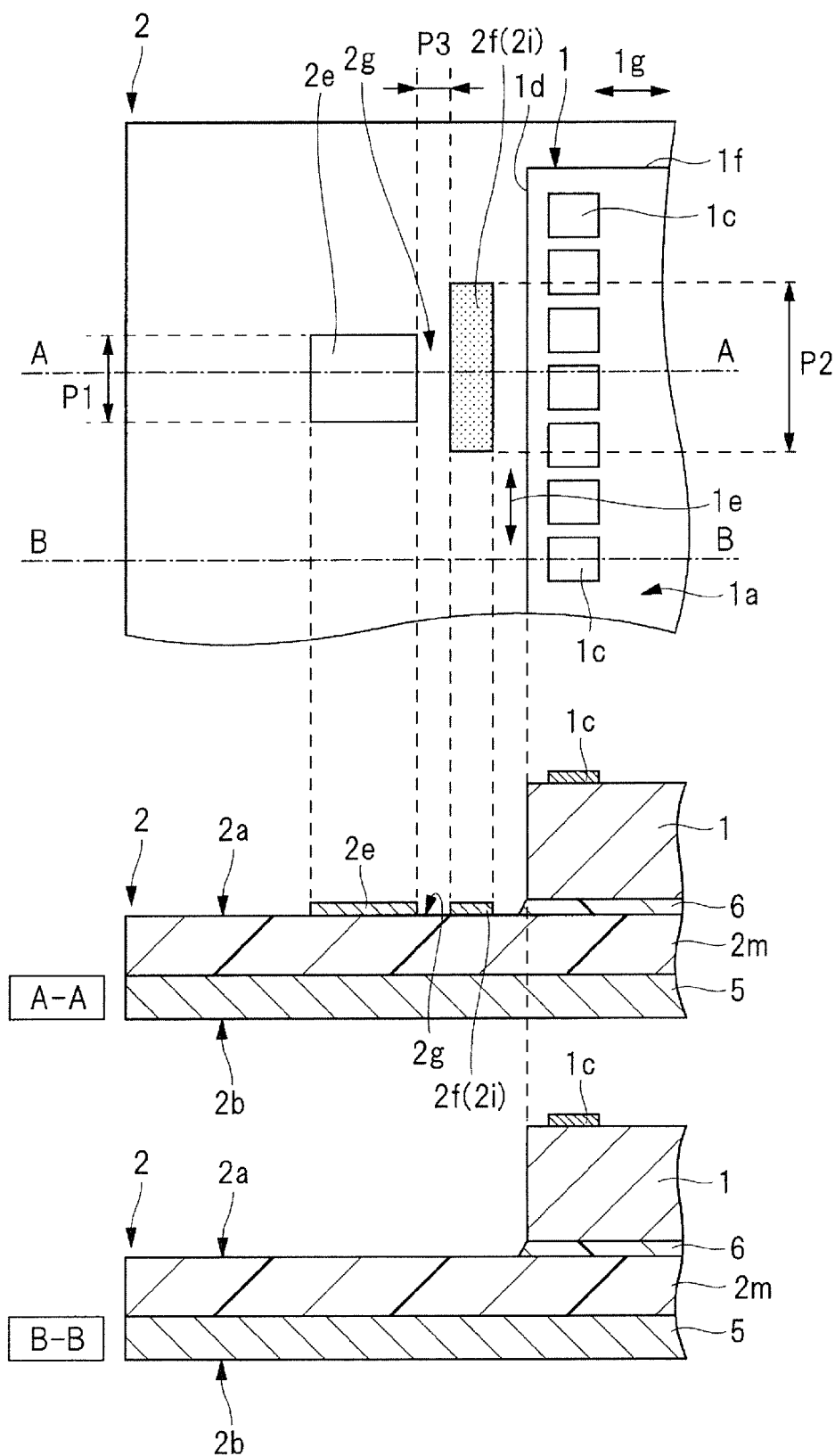
FIG. 4 includes a partial plan view, an A-A cross-sectional view, and a B-B cross-sectional view, showing an example of the relationship of the semiconductor device of FIG. 1 between the first region of the tape substrate and the land pad.
Figure 5:
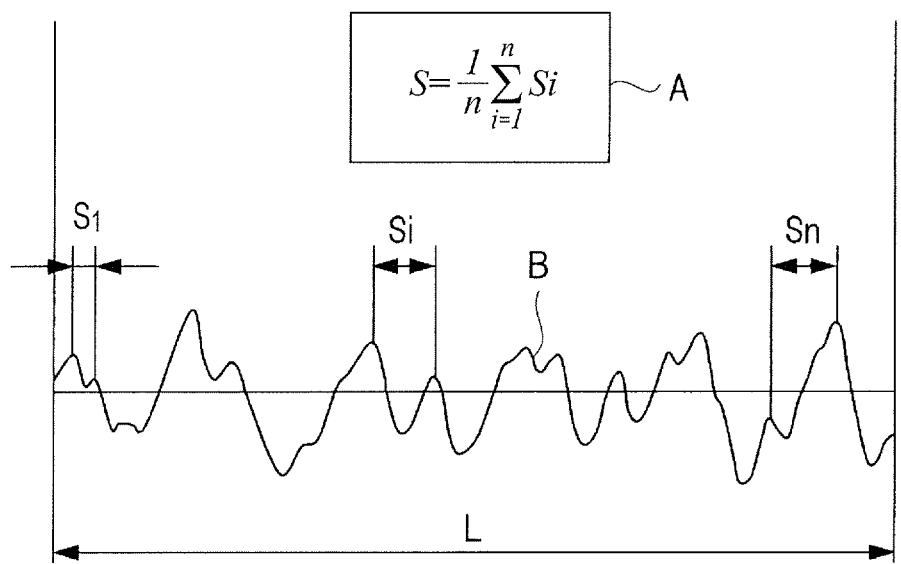
FIG. 5 is a conceptual diagram showing the definition of surface roughness of the first region in the tape substrate of the semiconductor device of FIG. 1.

FIG. 1 is a cross-sectional view showing an example of the structure of a semiconductor device according to the embodiment; FIG. 2 is a back view showing an example of the arrangement of external terminals on the back surface side of the semiconductor device of FIG. 1; and FIG. 3 is a cross-sectional view showing an example of the structure of a tape substrate to be used in the semiconductor device of FIG. 1. FIG. 4 includes a partial plan view, an A-A cross-sectional view, and a B-B cross-sectional view, showing an example of the relationship of the semiconductor device of FIG. 1 between the first region of the tape substrate and the land pad; and FIG. 5 is a conceptual diagram showing the definition of surface roughness of the first region in the tape substrate of the semiconductor device of FIG. 1.

Figure 19:
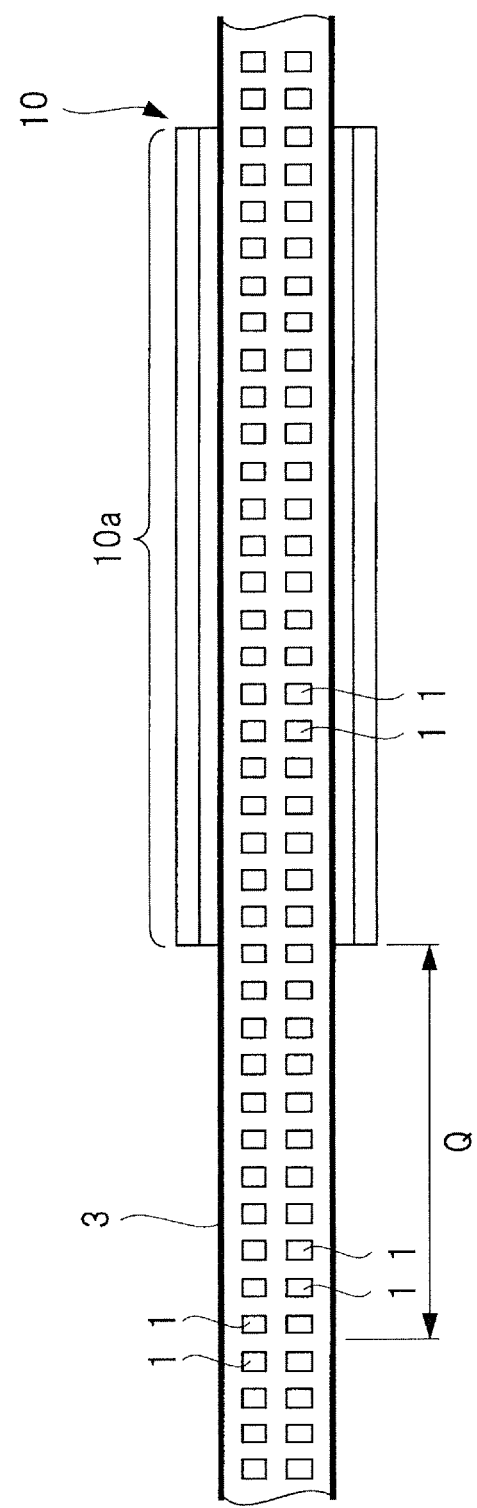
FIG. 19 is a conceptual diagram showing an example of heat treatment to be conducted in the baking step of FIG. 18.

The semiconductor device according to the present embodiment shown in FIGS. 1 and 2 is a substrate type semiconductor package fabricated using a multiple tape substrate 3 shown later in FIG. 19. In the present embodiment, a resin molded type COT (chip on tape) 8 having a semiconductor chip 1 mounted on a tape substrate 2 is given as an example of the above-mentioned semiconductor device and the structure of this COT8 and a manufacturing method thereof will be described.

First, the structure of the COT8 is described. It has, as shown in FIG. 1, a semiconductor chip 1 having a semiconductor integrated circuit formed thereon, a plurality of land pads 2e placed at the periphery of the semiconductor chip 1, a plurality of wires (metal wires) 7 for electrically coupling the semiconductor chip 1 and the land pads 2e, and a plurality of terminal portions 5, which are external terminals, provided on the lower surface 2b of the tape substrate 2. The terminal portions 5 of this structure are each made of a thin gold film.

As shown in FIG. 4, the surface 1a of the semiconductor chip 1 is substantially rectangular and the surface 1a has a first side 1d and a second side 1f intersecting (perpendicularly intersecting) the first side 1d. The first side 1d extends in a first direction 1e, while the second side 1f extends in a second direction 1g intersecting with the first direction 1e.

Figure 10:
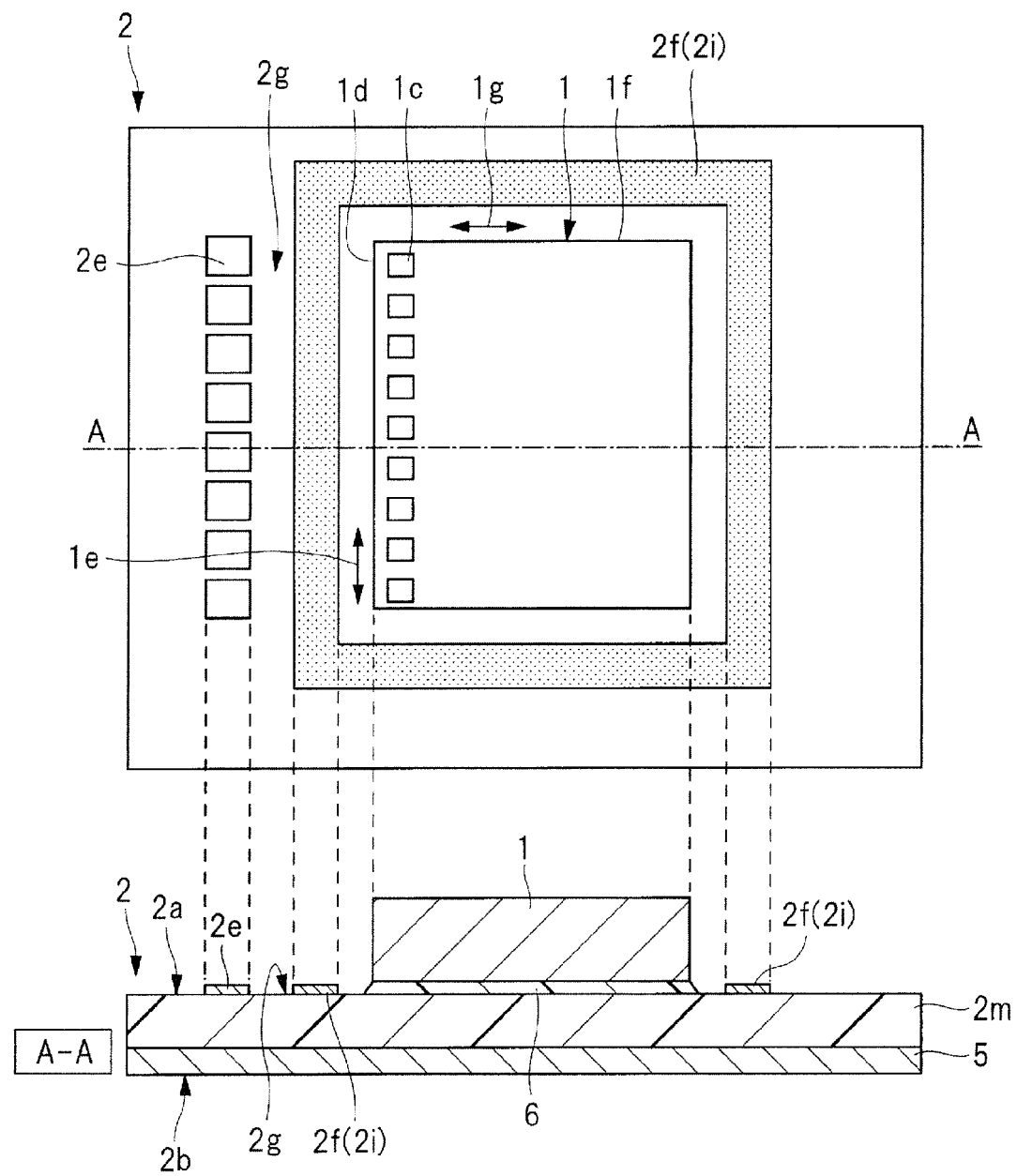
FIG. 10 includes a partial plan view and an A-A cross-sectional view, showing a fifth modification example of the relationship of the semiconductor device of FIG. 1 between the first region of the tape substrate and the land pad.

The land pad 2e of the tape substrate 2 has been placed along the first direction 1e as shown in FIG. 10 and at the same time, opposite to the first side 1d of the semiconductor chip 1.

As shown in FIG. 1, a plurality of electrode pads (pads) 1c formed on the surface 1a of the semiconductor chip 1 and the plurality of land pads 2e corresponding to the electrode pads have been electrically coupled to each other with a plurality of wires (metal wires) 7, respectively. The wires 7 are, for example, gold (Au) or copper (Cu) wires.

Further, in this COT8, the semiconductor chip 1 has been fixed on the upper surface (first main surface) 2a of the tape substrate 2 with a die bond material (adhesive material) 6. This means that the back surface 1b of the semiconductor chip 1 has been bonded to the upper surface 2a of the tape substrate 2 with the die bond material 6. The die bond material 6 is made of, for example, a material having an epoxy resin as a main component. The components of the die bond material can be classified roughly into a low molecular component and a high molecular component.

The semiconductor chip 1 and the wires 7 are molded, on the side of the upper surface 2a of the tape substrate 2, with a molding body 4 comprised of a molding resin or the like.

As shown in FIG. 2, the tape substrate 2 has, on the lower surface 2b thereof, a plurality of terminal portions 5 which will serve as an external terminal. Here, as shown in FIG. 2, the tape substrate 2 as shown in FIG. 1 has, on the lower surface 2b thereof, eight terminal portions 5. This means that the tape substrate 2 has the upper surface 2a and the lower surface 2b on the side opposite thereto. This lower surface 2b has thereon the plurality of terminal portions 5 which will serve as an external terminal. As shown in FIG. 3, a portion of the surface facing the same direction as that of the upper surface 2a of the tape substrate 2 above the terminal portions 5 is the land pad 2e. By such a configuration, the plurality of terminal portions 5 serving as an external terminal and the plurality of land pads 2e are electrically coupled to each other.

The tape substrate 2 is made of, as shown in FIG. 3, a base material 2m composed of a glass epoxy resin or the like and the terminal portion 5 attached to the lower surface 2b of the base material 2m via an adhesive material 2n and it has flexibility. The terminal portion 5 is, for example, a copper (Cu) foil coated in nickel (Ni)-gold (Au) plating.

In the COT8, as shown in FIG. 4, the land pad 2e on the tape substrate 2 and the semiconductor chip 1 have therebetween a first region 2f (P3>0) and the land pad 2e and the first region 2f have therebetween a second region 2g. In the structure shown in FIG. 4, the first region 2f is, for example, a resist film 2i and the second region 2g has a surface made of an insulating film such as glass epoxy resin which configures the base material 2m.

The length P2 of the first region 2f in the first direction 1e is longer than the length P1 of the land pad 2e in the first direction 1e (P2>P1). The first region 2f is formed with a surface height greater than the surface height of the second region 2g.

The first region 2f may be formed in at least a region between the land pad 2e and the semiconductor chip 1 and it may extend more from the region between the land pad 2e and the semiconductor chip 1 to surround the land pad 2e or semiconductor chip 1.

The COT8 in the present embodiment is characterized in that in a planar view, an average distance between local peaks of the surface roughness of the first region 2f between the land pad 2e on the tape substrate 2 and the semiconductor chip 1 is smaller than an average distance between local peaks of the surface roughness of the second region 2g between the land pad 2e and the first region 2f on the tape substrate 2.

Here, the average distance S between local peaks is described. The average distance S between local peaks is, as shown in FIG. 5, obtained by extracting only a reference length L from a roughness curve B in the direction of its average line, determining the length of the average line corresponding to the length between the local peaks adjacent to each other, and expressing, in millimeter (mm), an average value of many distances between local peaks found based on Equation A.

It is possible to express the fineness of the surface roughness by counting the number of irregularities in a certain length and measuring the distance between convexes (or concaves) adjacent to each other, thereby determining an average of the distance. The smaller the average distance, the finer the surface roughness.

Described specifically, in the tape substrate 2 of the COT8, the average distance between local peaks in the first region 2f in the vicinity of the semiconductor chip 1 is smaller than that in the second region 2g in the vicinity of the land pad 2e, meaning finer surface roughness. In other words, a smaller average distance S between local peaks means a shorter (smaller) distance between convexes (or concaves) in the surface roughness. Then, a bleed 20 (oozing, refer to FIG. 22 which will be described later) coming from the die bond material 6 runs through a small (narrow, short-distance) gap, which is accelerated similar to capillary action.

As described above, by making the average distance between local peaks of the surface roughness smaller in the first region 2f than in the second region 2g, it is possible, for example in a cure baking (heat treatment) step or the like after die bonding in the fabrication of the COT8, to positively allow a bleed (oozing) 20 to run (allow it to penetrate or diffuse) along the first region 2f when the bleed (oozing) occurs from a die bond material, more specifically, the die bond material 6. As a result, the bleed 20 can be prevented from running to (or penetrating in) the land pad 2e.

In addition, in the present embodiment, the length of the first region 2f is made longer than that of the land pad 2e. This makes it possible to more completely prevent the bleed 20 from attaching to the land pad 2e because the bleed 20 scatters on (attaches to) the first region 2f and when the bleed 20 proceeds on (penetrates in) the first region 2f, it proceeds (penetrates) in the first direction 1e so as to be away from the land pad 2e placed on a line of the second direction 1g. As a result, contact of the bleed 20 with the wire bonding land pad 2e (encroaching of the bleed 20 on the land pad 2e) decreases so that a wire can be stably bonded to the land pad 2e in a wire bonding step.

The "bleed (bleeding)" described in the present embodiment is different in occurrence mechanism from the so-called "flow out of the die bond material (adhesive material) 6". The reason is described below.

The "bleed (bleeding)" is a phenomenon, as described above in the summary, in which in cure baking of the die bond material 6, the die bond material 6 is separated into a high molecular component and a low molecular component after thinning (viscosity reduction) and then the low molecular component scatters. The die bond material 6 having, as a main component, an ordinary epoxy resin can be classified roughly into two types, that is, "solvent type" and "solvent-free type".

In the "solvent type", when the die bond material 6 is cure baked, the "solvent (low molecular component)" itself scatters as a result of the curing reaction, which appears as a bleeding phenomenon. The "solvent-free type" contains no solvent as it literally says and instead of the solvent, it contains a "reactive diluent" as a low molecular component. In this solvent-free type, when the die bond material 6 is cure baked, the reactive diluent scatters and causes a bleeding phenomenon. Anyway, both the solvent type and the solvent-free type contain the "low molecular component". In the die bond material 6, this "low molecular component" plays an important role.

The die bond material 6 is an adhesive material for bonding the semiconductor chip 1 and a base material (wiring board, leadframe, or the like). To achieve good adhesion, the die bond material 6 should have good "wettability" with the semiconductor chip (for example, Si) 1 and the base material (an epoxy resin or a metal such as Cu). To achieve good "wettability", a reduction in the viscosity of the die bond material 6 is necessary. For reducing the viscosity, increasing the content of the low molecular component is effective. An increase in the content of the low molecular component is likely to cause bleeding, meaning that in the die bond material, "improvement in wettability" and "occurrence ratio of bleeding" are contradictory to each other.

The above-mentioned "flow-out of the die bond material 6" is a phenomenon occurring due to an "excessive amount of the die bond material 6". In order to prevent the flow-out of the die bond material, decreasing (optimizing) the amount of the die bond material 6 is required. As mentioned above, however, "bleed" is a problem depending on the amount (content) of the low molecular component contained in the die bond material so that it cannot be solved only by decreasing the amount of the die bond material 6. Formation of a dam (convex portion) or a recess (concave portion) on the wiring board is thought as a measure for preventing the die bond material 6 from flowing out to the land pad 2e. The bleed however crosses such a dam or recess and encroaches on the surface of the land pad so that the problem cannot be solved easily.

In the present embodiment, some characteristics have been described, but main characteristics described above will solve the problems typical to the bleed.

Next, modification examples shown in FIGS. 6 to 12 are described.

Figure 6:
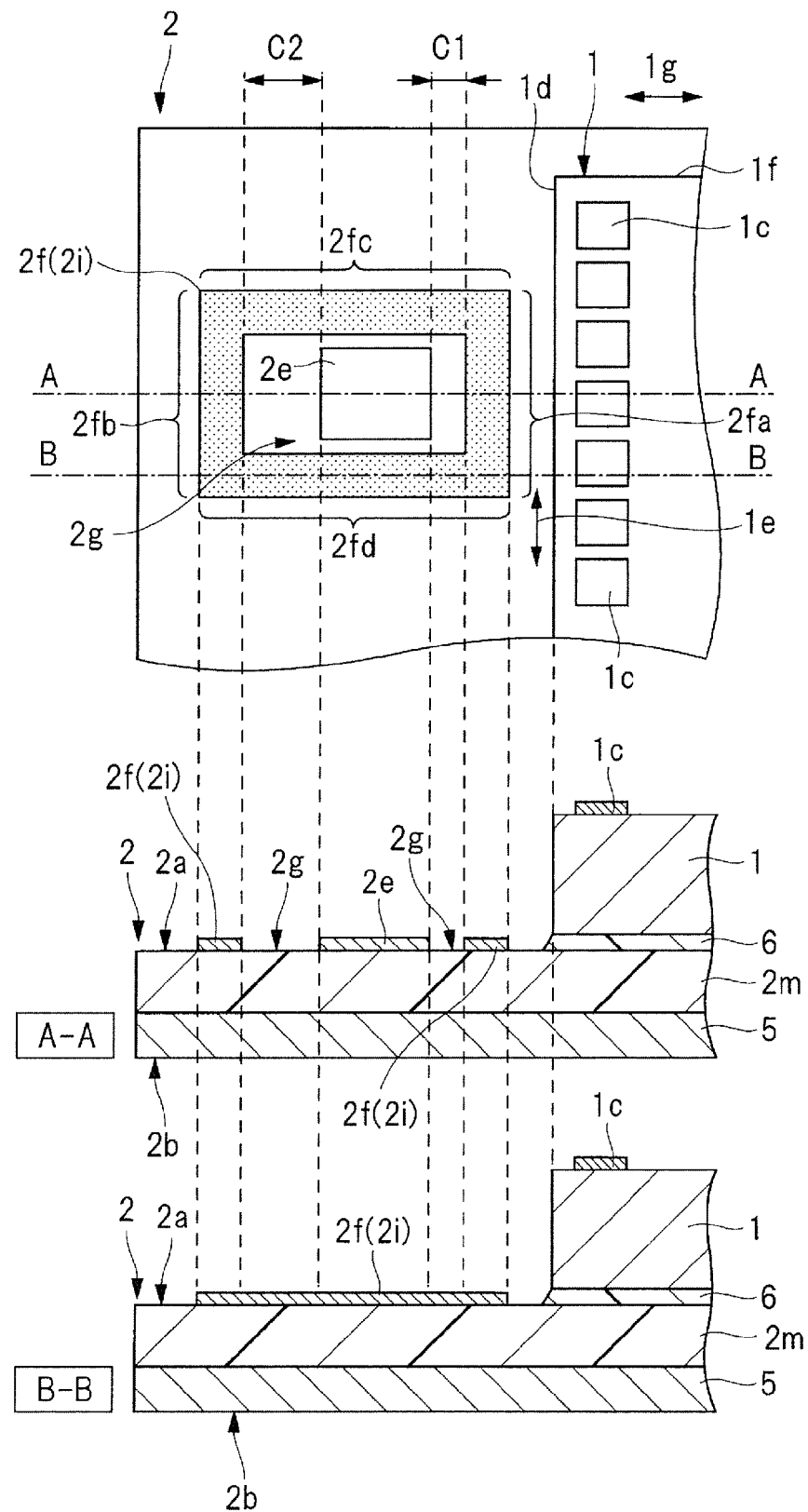
FIG. 6 includes a partial plan view, an A-A cross-sectional view, and a B-B cross-sectional view, showing a first modification example of the relationship of the semiconductor device of FIG. 1 between the first region of the tape substrate and the land pad.
Figure 7:
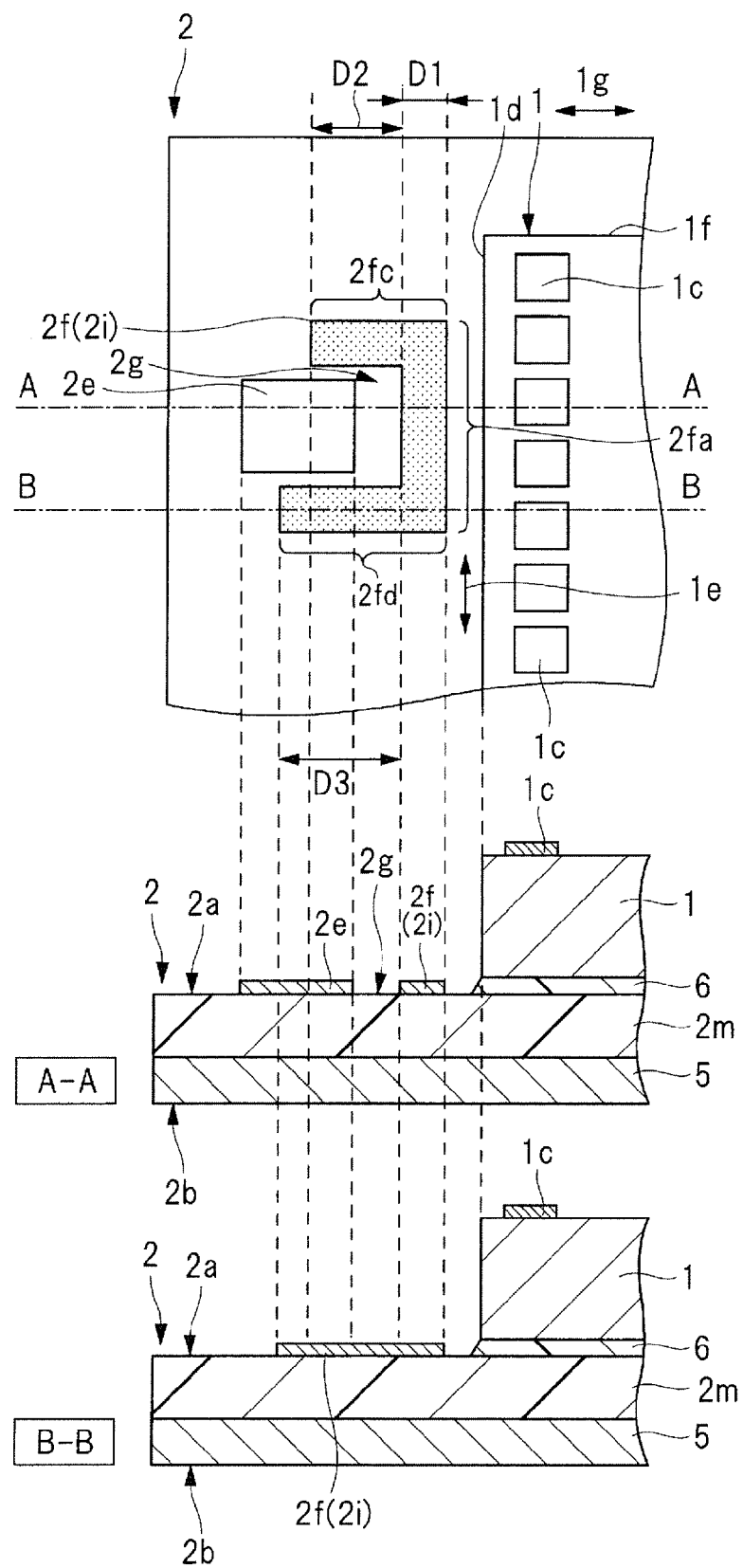
FIG. 7 includes a partial plan view, an A-A cross-sectional view, and a B-B cross-sectional view, showing a second modification example of the relationship of the semiconductor device of FIG. 1 between the first region of the tape substrate and the land pad.
Figure 8:
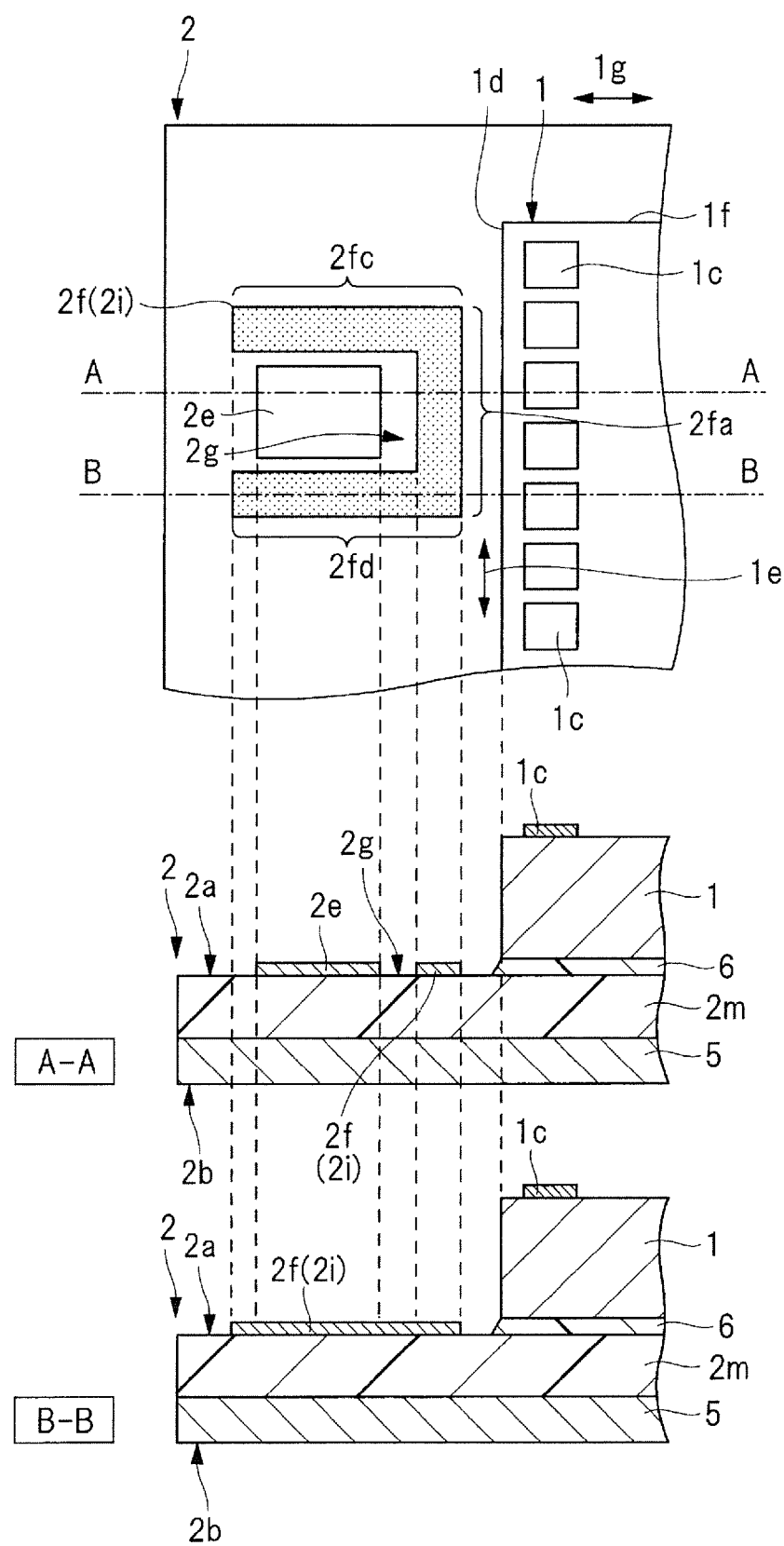
FIG. 8 includes a partial plan view, an A-A cross-sectional view, and a B-B cross-sectional view, showing a third modification example of the relationship of the semiconductor device of FIG. 1 between the first region of the tape substrate and the land pad.
Figure 9:
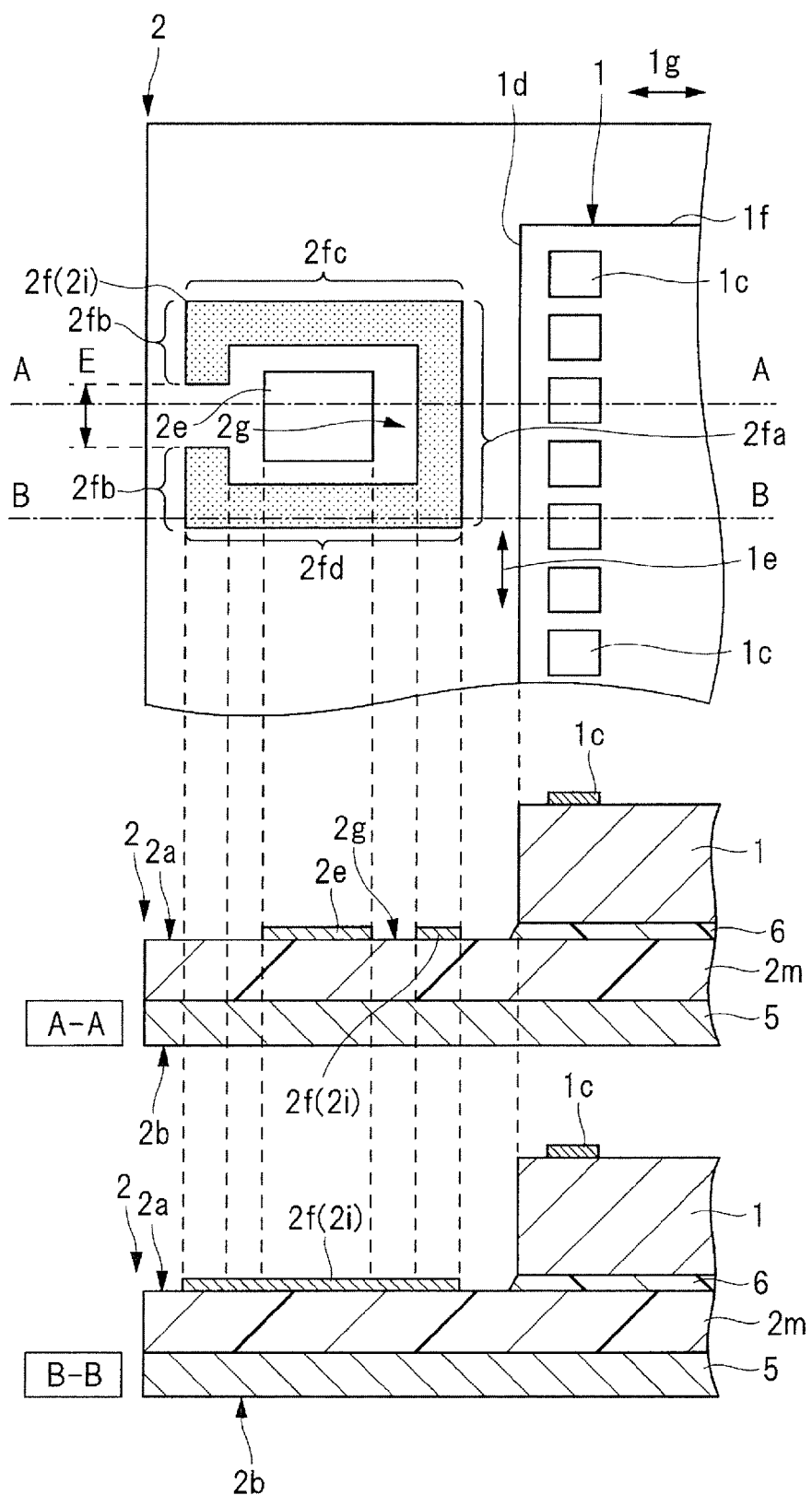
FIG. 9 includes a partial plan view, an A-A cross-sectional view, and a B-B cross-sectional view, showing a fourth modification example of the relationship of the semiconductor device of FIG. 1 between the first region of the tape substrate and the land pad.
Figure 11:
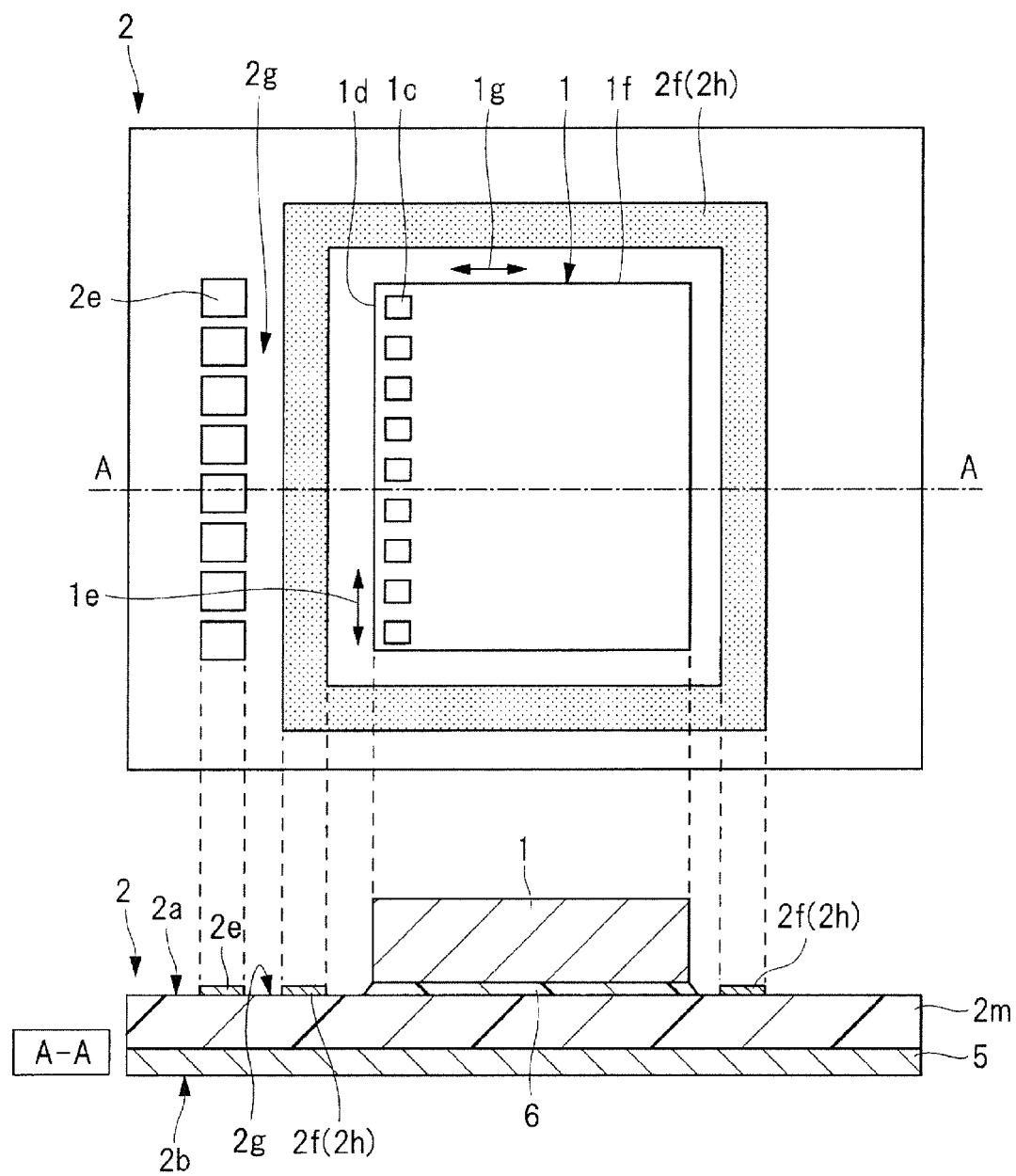
FIG. 11 includes a partial plan view and an A-A cross-sectional view, showing a sixth modification example of the relationship of the semiconductor device of FIG. 1 between the first region of the tape substrate and the land pad.
Figure 12:
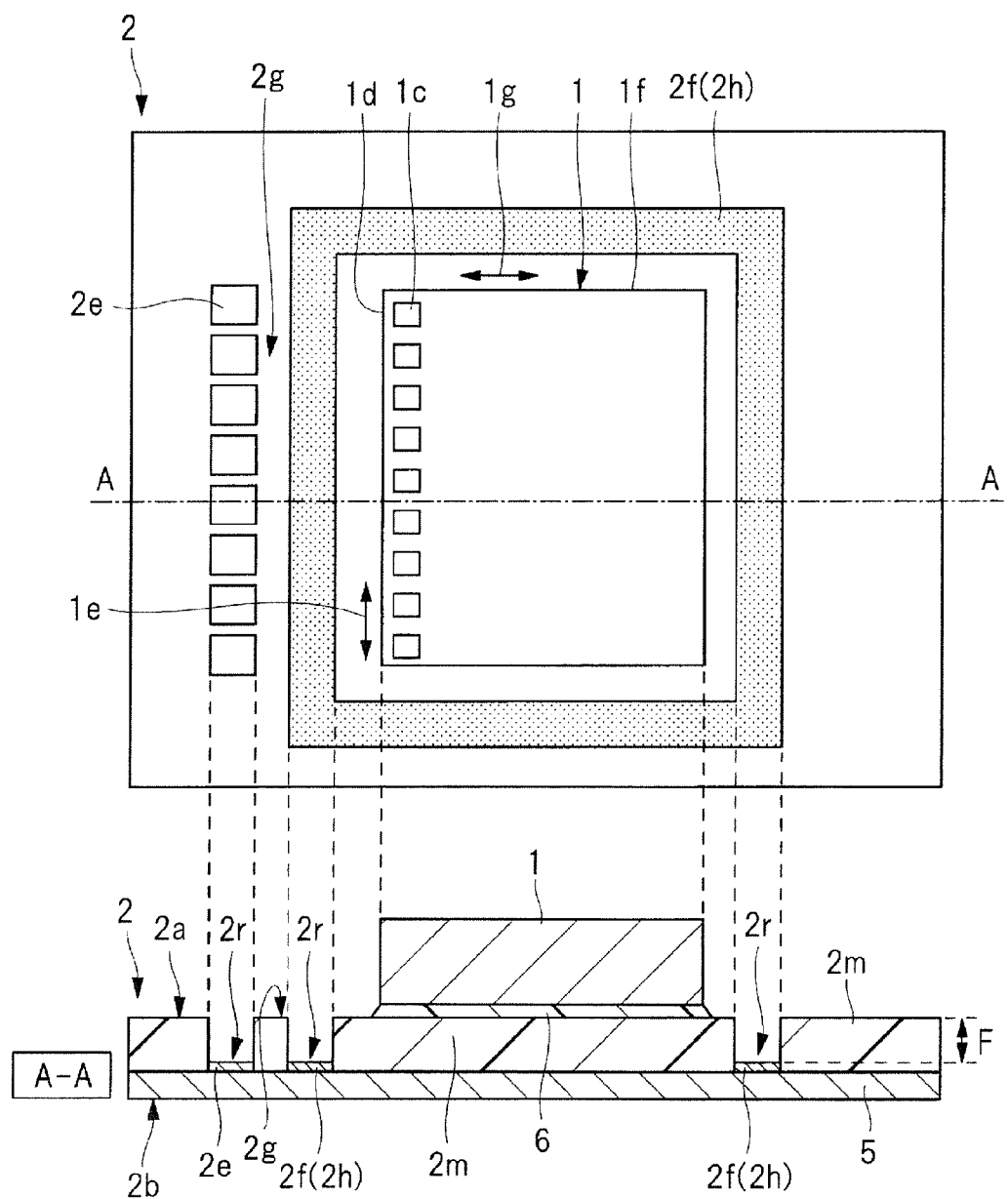
FIG. 12 includes a partial plan view and an A-A cross-sectional view, showing a seventh modification example of the relationship of the semiconductor device of FIG. 1 between the first region of the tape substrate and the land pad.

FIG. 6 includes a partial plan view, an A-A cross-sectional view, and a B-B cross-sectional view, showing a first modification example of the relationship of the semiconductor device of FIG. 1 between the first region of the tape substrate and the land pad; FIG. 7 includes a partial plan view, an A-A cross-sectional view, and a B-B cross-sectional view, showing a second modification example of the relationship of the semiconductor device of FIG. 1 between the first region of the tape substrate and the land pad; FIG. 8 includes a partial plan view, an A-A cross-sectional view, and a B-B cross-sectional view, showing a third modification example of the relationship of the semiconductor device of FIG. 1 between the first region of the tape substrate and the land pad; FIG. 9 includes a partial plan view, an A-A cross-sectional view, and a B-B cross-sectional view, showing a fourth modification example of the relationship of the semiconductor device of FIG. 1 between the first region of the tape substrate and the land pad; FIG. 10 includes partial plan view and an A-A cross-sectional view, showing a fifth modification example of the relationship of the semiconductor device of FIG. 1 between the first region of the tape substrate and the land pad; FIG. 11 includes a partial plan view and an A-A cross-sectional view, showing a sixth modification example of the relationship of the semiconductor device of FIG. 1 between the first region of the tape substrate and the land pad; FIG. 12 includes a partial plan view and an A-A cross-sectional view, showing a seventh modification example of the relationship of the semiconductor device of FIG. 1 between the first region of the tape substrate and the land pad.

In the first modification example shown in FIG. 6, the first region $2f$ has a frame shape in a planar view and it is placed so as to surround the entire periphery of the wire bonding land pad $2e$ (C1>0, C2>0).

The first region $2f$ includes a first portion $2fa$, a second portion $2fb$, a third portion $2fc$, and a fourth portion $2fd$. In a planar view, the first portion $2fa$ is placed between the land pad $2e$ and the semiconductor chip 1 and extends in the first direction $1e$. The second portion $2fb$ is placed at a position on the side opposite to the position at which the semiconductor chip 1 is placed, with respect to the land pad $2e$, so as to face with the first portion $2fa$. The land pad $2e$ is therefore placed between the first portion $2fa$ and the second portion $2fb$. The third portion $2fc$ is placed between the first portion $2fa$ and the second portion $2fb$ and extends along the second direction $1g$. Further, the third portion $2fc$ is, at one end thereof, coupled to the first portion $2fa$ and, at the other end, coupled to the second portion $2fb$. The fourth portion $2fd$ is placed between the first portion $2fa$ and the second portion $2fb$ and extends along the second direction $1g$. The fourth portion $2fd$ is placed opposite to the third portion $2fc$ so as to sandwich the land pad $2e$ with the third portion $2fc$. Further, the fourth portion $2fd$ is, at one end thereof, coupled to the first portion $2fa$ and, at the other end, coupled to the second portion $2fb$. As a result, the first region $2f$ comprised of the first portion $2fa$, the second portion $2fb$, the third portion $2fc$, and the fourth portion $2fd$ has a flame shape in a planar view.

Thus, by surrounding the entire periphery of the land pad $2e$ with the first region $2f$, the length of the first region $2f$ becomes greater further and the penetration distance of the bleed 20 on the first region $2f$ increases, (a diffusion area increases), making it possible to further reduce the adhesion (penetration) of the bleed 20 to the land pad $2e$.

The second modification example of FIG. 7 is similar to the first modification example of FIG. 6 except that a portion of the first region $2f$ is not placed. This means that in a planar view, a portion of the first region $2f$ on the side distant from the semiconductor chip 1 is not placed. Described specifically, it has a shape without the second portion $2fb$ of FIG. 6. Moreover, the third portion $2fc$ and the fourth portion $2fd$ have a length shorter than that in the first modification example and at the same time, the third portion $2fc$ and the fourth portion $2fd$ in the second direction $1g$ are different in length (D2>D1, D3>D1, D3>D2). Compared with the first modification example, a region in which the second portion $2fb$ has been placed becomes unnecessary because it is not placed so that the contour of the semiconductor device can be decreased by a size corresponding to the region. Further, in this example, the length of the third portion $2fc$ is shorter than that of the fourth portion $2fd$. When a wiring should be lead from the land pad $2e$, it is recommended to lead the wiring from the shortened third portion $2fc$. This makes it possible to prevent the thus-lead wiring from taking a long detour.

The third modification example shown in FIG. 8 is substantially similar to that shown in FIG. 7 and has a shape deprived of a portion of the first region $2f$. This means that in a planar view, it does not have a portion of the first region $2f$ on the side distant from the semiconductor chip 1. Described specifically, it has a shape without the second portion 2fb of FIG. 6. The third portion 2fc and the fourth portion 2fd have an equal length. This makes it possible to prevent the bleed 20 from attaching (penetrating) to the land pad 2e more reliably than the second modification example because the third portion 2fc and the fourth portion 2fd are not shortened and they are as long as those in the first modification example. When a wiring should be lead from the land pad 2e, it may be lead from a region where the second portion 2fb was arranged.

The fourth modification example shown in FIG. 9 has a shape similar to that of the first modification example shown in FIG. 6 except that the second portion 2fb in the first region 2f is disconnected. More specifically, in a planar view, the second portion 2fb has a shape such that the second portion 2fb is disconnected and is divided. In other words, a portion of the second portion 2fb in the frame-like first region 2f is opened (E>0). Since the first region has still a portion of the second portion 2fb compared with the third modification example, it is possible to prevent the bleed 20 from attaching to (penetrating in) the land pad 2e more reliably than the third modification example. The present fourth modification example is effective when it has a lead wiring and the lead wiring has a line width finer than that of the third modification example.

Although modification examples shown in FIG. 7, FIG. 8, and FIG. 9, respectively, produce a similar advantage to that of the structure shown in FIG. 4, the first region 2f having a length as long as possible is preferred because it increases the running and diffusing distance of the bleed (refer to FIG. 22) 20. This means that the first region 2f having four sides coupled as a frame shape as shown in the first modification example of FIG. 6 is most effective for maximizing (increasing) the running and diffusing distance (wetting and spreading area) of the bleed 20.

Next, in the fifth modification example shown in FIG. 10, the first region 2f has, in a planar view, a frame shape with which the periphery of the semiconductor chip 1 has been surrounded. In this case, different from the first modification example of FIG. 6 in which the land pad 2e is surrounded with the first region 2f, the semiconductor chip 1 is surrounded with the first region 2f. When a plurality of the land pads 2e is arranged, this makes it possible to suppress the arrangement pitch of the land pads 2e from widening (increasing). This example is therefore effective for the case where the number of the land pads 2e is large and the arrangement pitch of them should be decreased (narrowed).

In the sixth modification example shown in FIG. 11, the first region 2f has a frame shape in a planar view and at the same time, the surface of the first region 2f is coated in Au plating 2h.

Using a metal film such as Au plating 2h as the surface of the first region 2f makes the average distance between local peaks of the surface roughness of the metal film smaller than the average distance of local peaks of the surface roughness of the second region 2g made of an ordinary resist film (solder resist film). This facilitates running (penetration) of the low molecular component (bleed 20) of the die bond material 6 on the surface of the first region 2f, resulting in prevention of the bleed 20 from running to (penetrating in) the land pad 2e and attaching thereto. Moreover, when the surface of the first region 2f is made of an Au plating, the die bond material 6 never adheres (bonds) to the Au plating, which is effective for allowing the bleed 20 to run on (penetrate in) the surface of the first region 2f.

Moreover, by using the frame-shaped first region, the running and diffusing distance of the bleed 20 can be made longer and the bleed 20 can be prevented from attaching to the land pad 2e with an increased probability. In addition, coating of the first region 2f in Au plating 2h can be conducted simultaneously in a step of coating the land pad 2e in Au plating in the manufacturing steps of the substrate so that it does not increase the number of manufacturing steps of the substrate and therefore does not increase the cost of the substrate.

In the seventh modification example shown in FIG. 12, the height of the surface of the first region 2f is made lower than the height of the surface (surface on which a chip is to be mounted) of the second region 2g (F>0). A groove portion 2r is formed in the base material 2m of the tape substrate 2 and then the first region 2f is formed in this groove portion 2r. The surface of the first region is coated in Au plating 2h.

The first region 2f is thus formed in the groove portion 2r and therefore, the first region 2f has a reduced surface height so that the side surface (inner wall) of the groove portion 2r becomes useful as a portion (region) for diffusing the bleed 20. This means widening of the area of the first region 2f. Compared with widening in the planar direction, the semiconductor device can be prevented from becoming large. In short, such a structure is effective for downsizing of the semiconductor device. Moreover, the first region 2f has a surface coated in Au plating 2h so that the bleed 20 runs in the groove portion 2r and the bleed 20 can be prevented from climbing up (a chip mounting surface).

Since the groove portion 2r is formed, even if the die bond material 6 is applied too much and it flows out, this groove portion 2r can stop the flow-out of the die bond material 6. In other words, the present seventh modification example can solve both the above-described problems, that is, "bleed" and "flow-out of the die bond material 6".

Next, the fabrication of the semiconductor device (COT8) of the present embodiment will be described.

Figure 13:
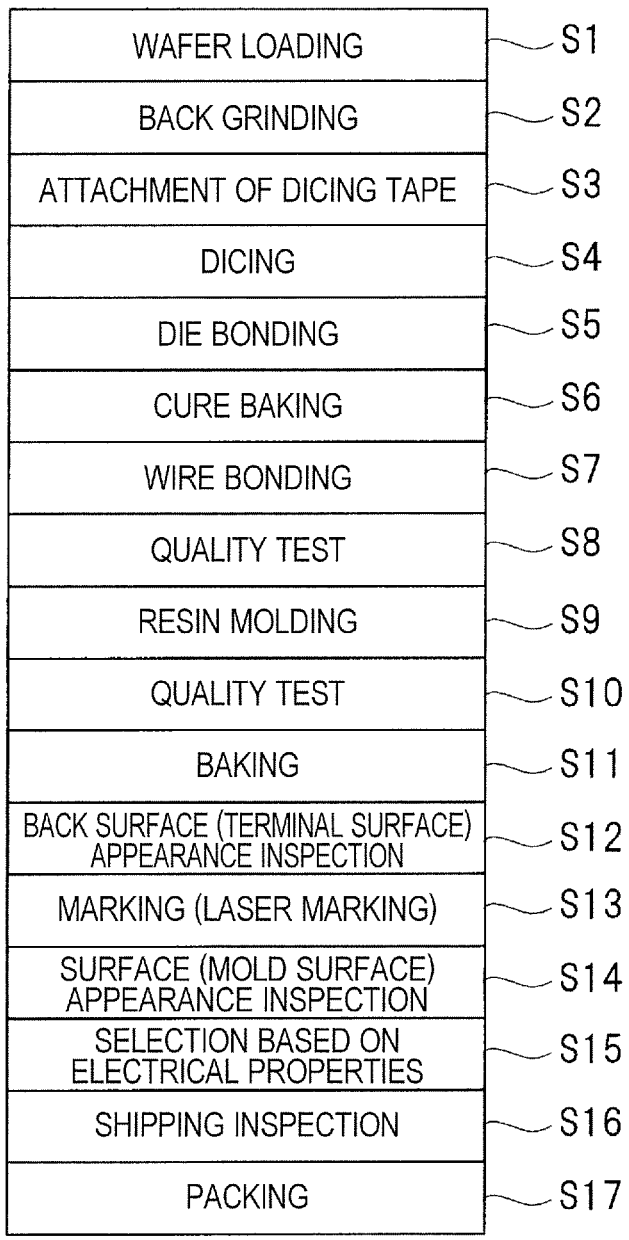
FIG. 13 is a flow chart showing an example of the fabrication procedure of the semiconductor device of FIG. 1.
Figure 14:
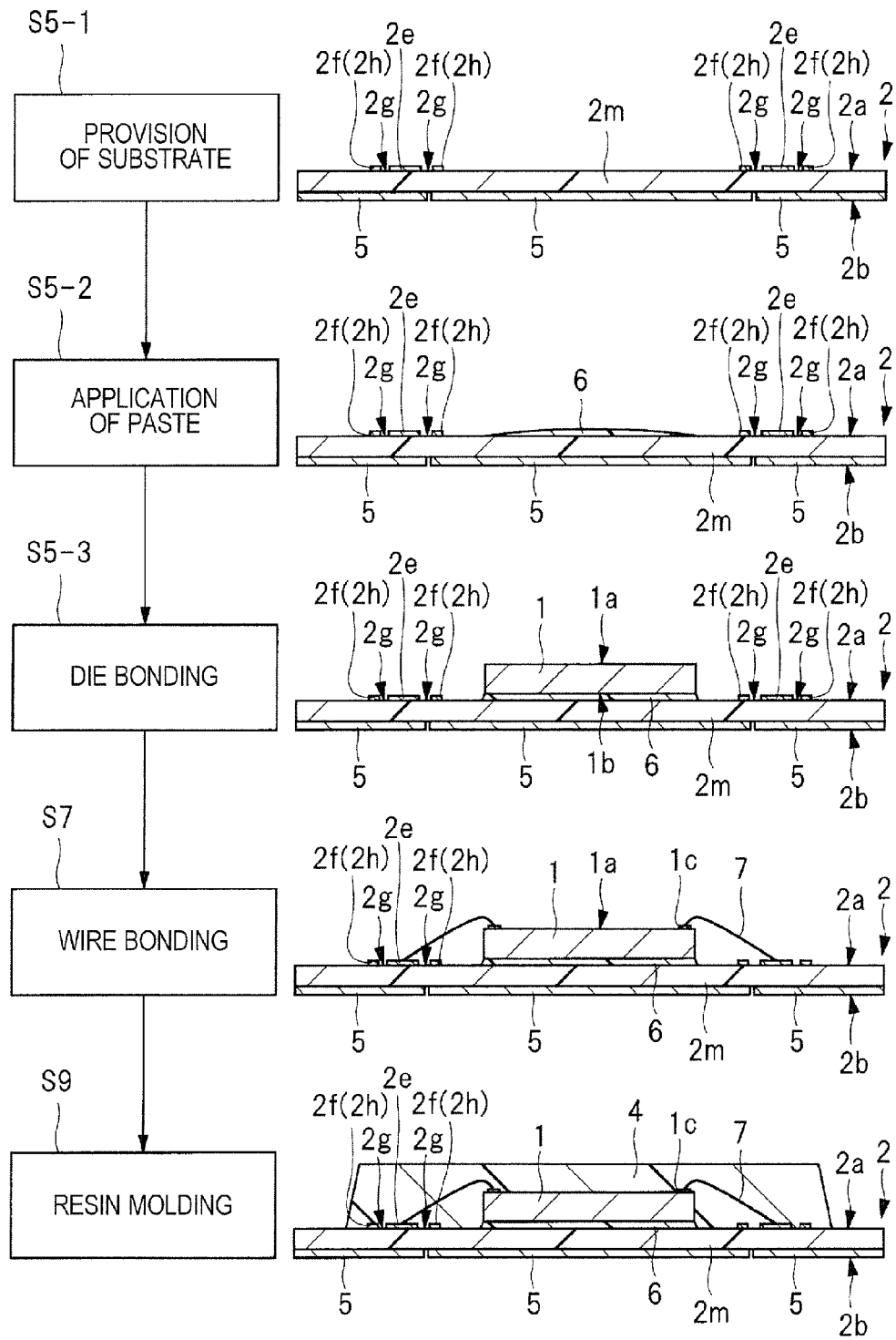
FIG. 14 is a process flow chart showing an example of main steps in the fabrication of the semiconductor device of FIG. 1.
Figure 15:
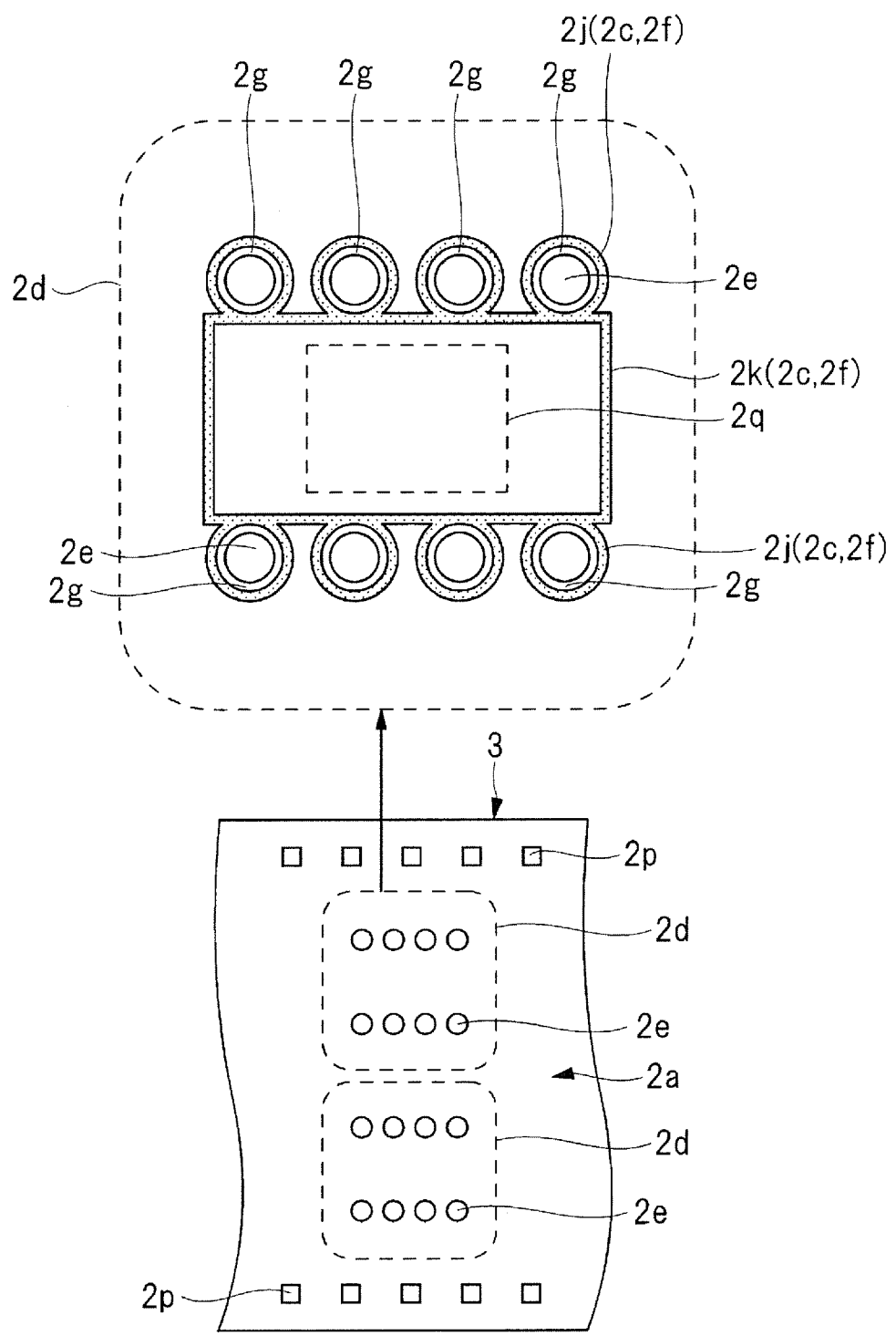
FIG. 15 includes an enlarged plan view and a partial plan view showing an example of a substrate provided state in the main steps of FIG. 14.
Figure 16:
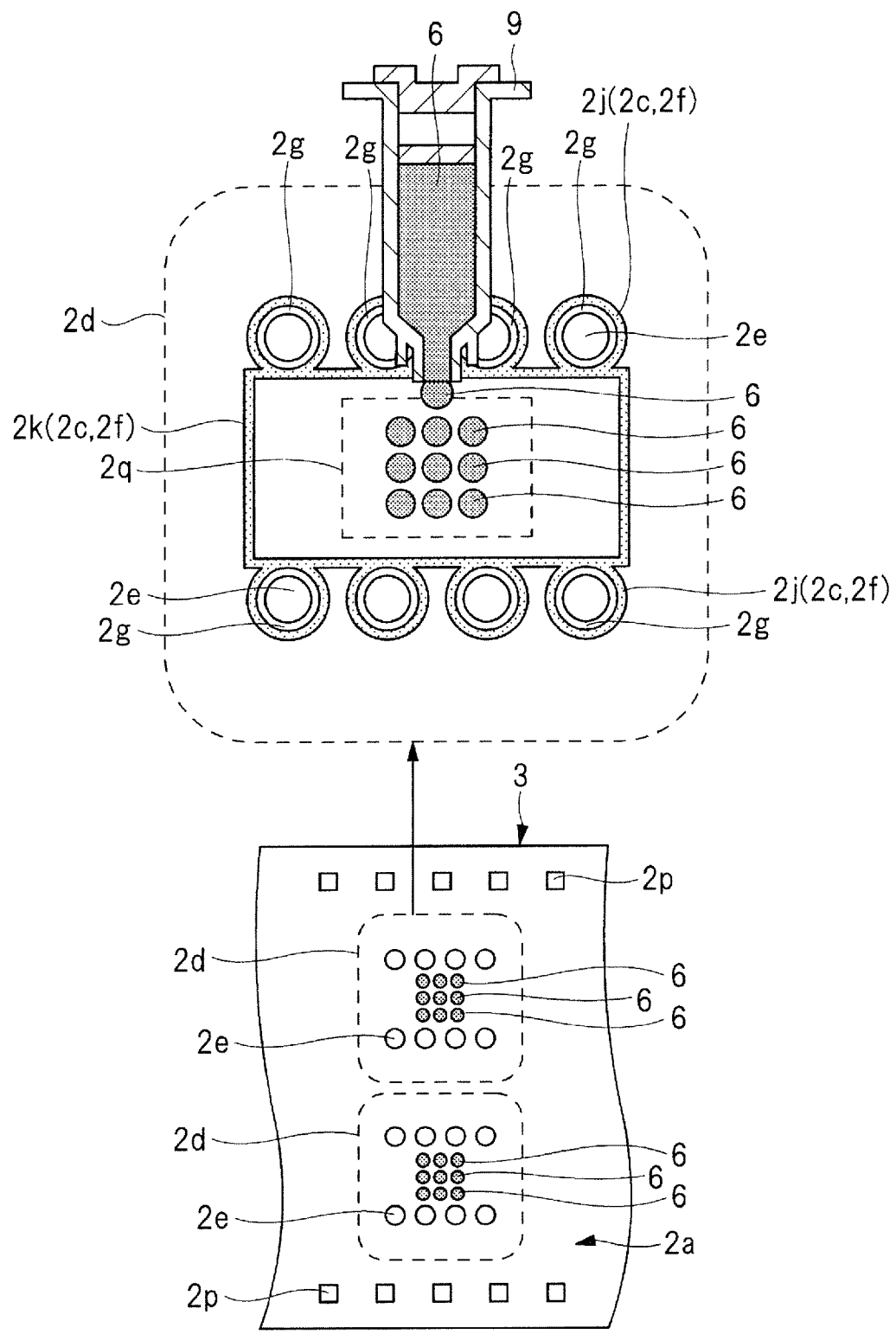
FIG. 16 includes an enlarged plan view and a partial plan view showing an example of a paste applied state in the main steps of FIG. 14.
Figure 17:
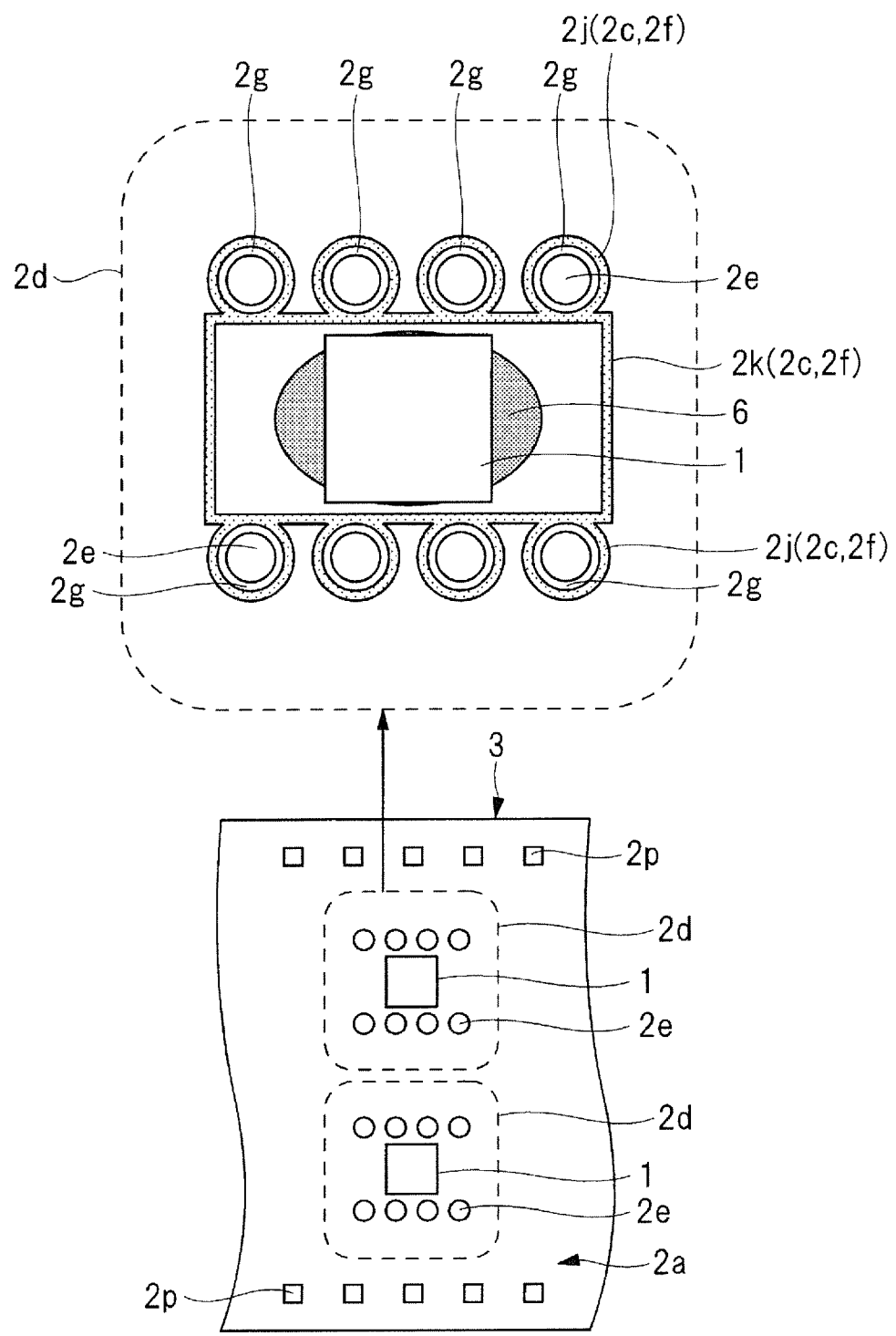
FIG. 17 includes an enlarged plan view and a partial plan view showing an example of a die bonded state in the main steps of FIG. 14.
Figure 18:
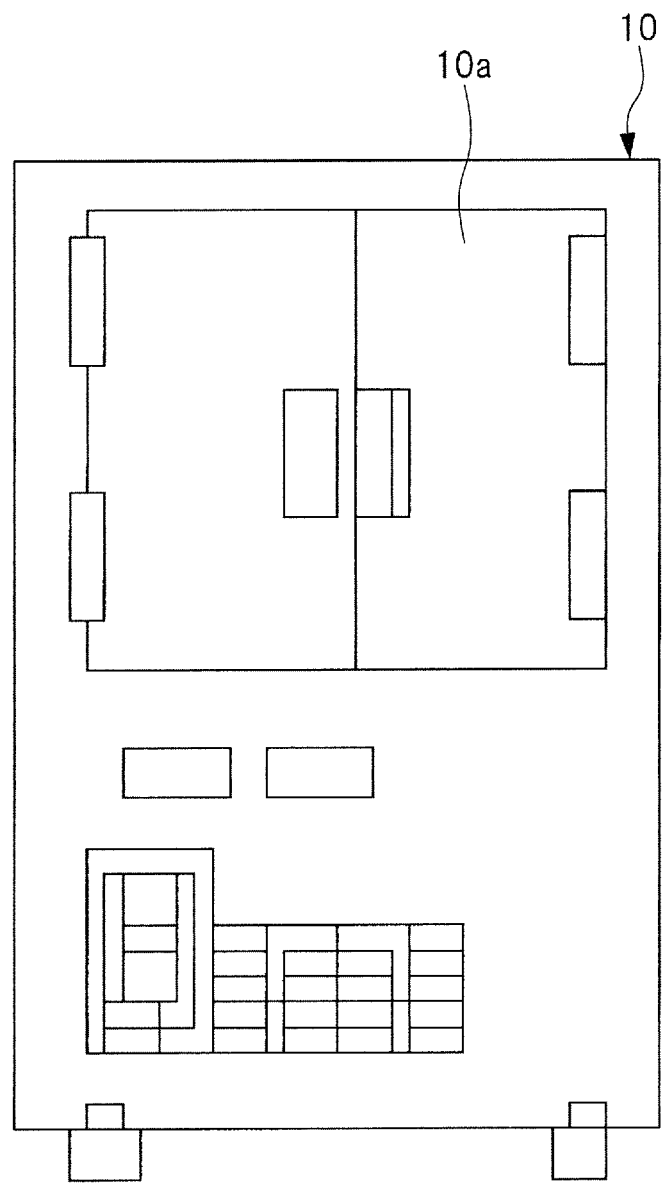
FIG. 18 is a conceptual diagram showing an example of a heat treatment apparatus to be used in a baking step after die bonding in FIG. 17.
Figure 21:
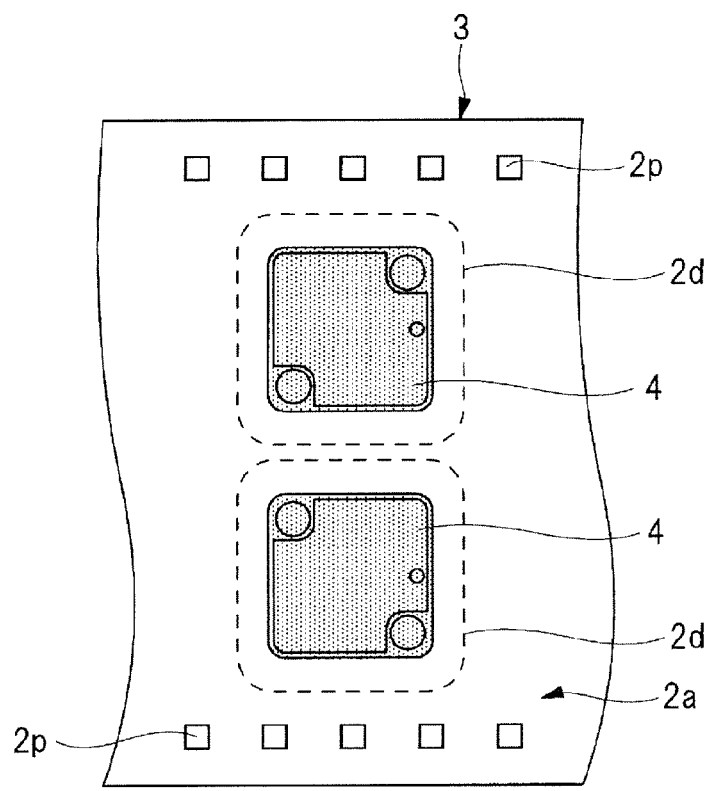
FIG. 21 is a partial plan view showing an example of the structure after resin molding in the main steps of FIG. 14.
Figure 22:
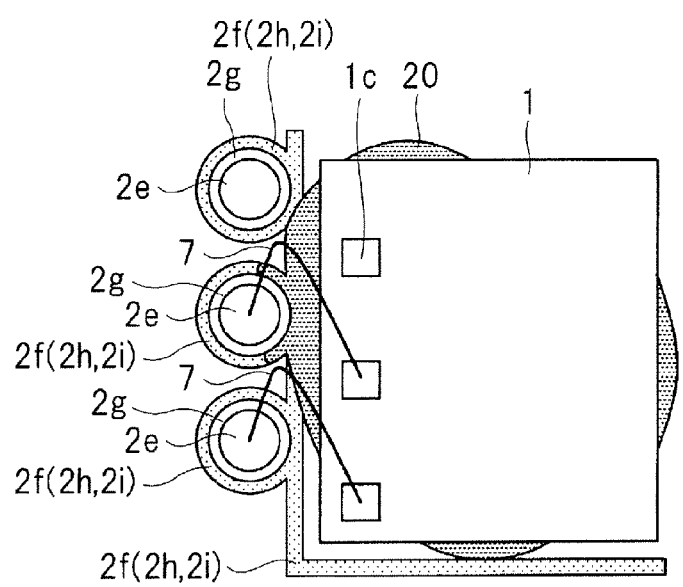
FIG. 22 is a conceptual diagram showing the mechanism of the effect of fabrication of the semiconductor device according to the embodiment.
Figure 23:
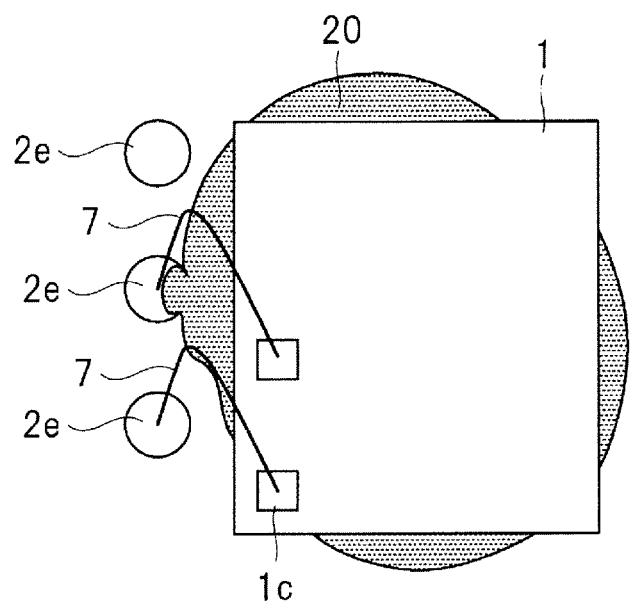
FIG. 23 is a conceptual diagram showing the encroached state caused by bleed in Comparative Example.

FIG. 13 is a flow chart showing an example of the fabrication procedure of the semiconductor device of FIG. 1; FIG. 14 is a process flow chart showing an example of main steps in the fabrication of the semiconductor device of FIG. 1; FIG. 15 includes an enlarged plan view and a partial plan view showing an example of a substrate provided state in the main steps of FIG. 14; FIG. 16 includes an enlarged plan view and a partial plan view showing an example of a paste applied state in the main steps of FIG. 14; FIG. 17 includes an enlarged plan view and a partial plan view showing an example of a die bonded state in the main steps of FIG. 14; FIG. 18 is a conceptual diagram showing an example of a heat treatment apparatus to be used in a baking step after die bonding in FIG. 17; and FIG. 19 is a conceptual diagram showing an example of heat treatment to be conducted in the baking step of FIG. 18. Further, FIG. 20 includes an enlarged plan view and a partial plan view showing an example of a wire bonded state in the main steps of FIG. 14; FIG. 21 is a partial plan view showing an example of the structure after resin molding in the main steps of FIG. 14; FIG. 22 is a conceptual diagram showing the mechanism of the effect of fabrication of the semiconductor device according to the embodiment; and FIG. 23 is a conceptual diagram showing the encroached state caused by bleed in Comparative Example.

First, wafer loading (receiving) of Step S1 in FIG. 13 is conducted. In this step, a semiconductor wafer (not illustrated) having a plurality of chip formation regions is loaded and provided. Then, by back grinding of Step S2, the back surface of the semiconductor wafer is ground to a desired thickness.

Then, attachment of a dicing tape shown in Step S3 is conducted. Described specifically, a dicing tape is attached to the back surface of the semiconductor wafer. Then the wafer is cut into individual chips by dicing in Step S4 to obtain a good semiconductor chip 1.

Then, die bonding shown in Step S5 is conducted. First, provision of a substrate shown as Step S5-1 in FIG. 14 is conducted. In this step, a multiple tape substrate (wiring board) 3 having an upper surface 2a on which a plurality of land patterns 2c has been formed as shown in the enlarged view and plan view in FIG. 15 is provided.

The multiple tape substrate 3 has a plurality of device regions 2d and the device regions 2d each have a plurality of first patterns (including the first region 2f) surrounding therewith a plurality of land patterns 2c and a plurality of land pads 2e shown in the enlarged view of FIG. 15 and a second pattern (including the first region 2f) 2k surrounding therewith a chip mounting region 2q.

In the fabrication of the semiconductor device according to the present embodiment, combination of a pattern (the first pattern 2j including the first region 2f) surrounding the land pad 2e of FIG. 6 and a pattern (second pattern 2k including the first region 2f) surrounding the semiconductor chip 1 of FIG. 11 formed in each of the device regions 2d of the multiple tape substrate 3 will be described as an example.

This means that the first pattern 2j and the second pattern 2k are both first regions 2f and their surfaces have been coated, for example, in Au plating 2h as shown in FIG. 11. Moreover, the average distance between local peaks of the surface roughness of the first pattern 2j and the second pattern 2k which are first regions 2f is smaller than the average distance between local peaks of the surface roughness of the second region 2g (refer to FIG. 4) made of an insulating film between the land pad 2e and the first region 2f.

The multiple tape substrate 3 shown in the enlarged view of FIG. 15 has, at both ends thereof in the width direction, a plurality of sprocket holes 2p for a carrying guide at equal intervals. Moreover, the multiple tape substrate 3 is, as shown in Step S5-1 of FIG. 14 and FIG. 3, comprised of a base material 2m made of a glass epoxy resin or the like and a terminal portion 5 attached to the lower surface 2b opposite to the upper surface 2a of the base material 2m via an adhesive material 2n and it has flexibility. The terminal portion 5 is, for example, a copper (Cu) foil plated with nickel (Ni)-gold (Au).

Then, paste application as shown in Step S5-2 of FIG. 14 and the enlarged view and plan view of FIG. 16 is conducted. Described specifically, a die bond material (adhesive material) 6 for die bonding is applied to the chip mounting region 2q of each of the device regions 2d. Application is conducted, for example, by adding dropwise the die bond material 6 to the chip mounting region 2q of each of the device regions 2d by multi-spot coating system from a syringe 9.

The die bond material (adhesive material) to be applied is in paste form and has a low molecular component and a high molecular component. It is made of, for example, a material having an epoxy resin as a main component.

Then, chip mounting (die bonding) shown in Step S5-3 of FIG. 14 and in the enlarged view and plan view of FIG. 17 is conducted. In this step, the semiconductor chip 1 is mounted in each chip mounting region 2q of FIG. 16 in the multiple tape substrate 3 via the die bond material 6 which is an adhesive material.

After completion of chip mounting, cure baking in Step S6 of FIG. 13 is conducted. In this cure baking, the die bond material 6 is cured at a temperature higher than the normal temperature. The heat treatment (curing treatment) is conducted as shown in FIG. 19 by passing the multiple tape substrate 3 through a baking furnace 10a of a heat treatment apparatus 10 shown in FIG. 18.

In the cure baking treatment, curing of the epoxy resin as an adhesive material starts, for example, at from 100° C. to 150° C. When the temperature exceeds the room temperature, for example, when a work (multiple tape substrate 3) is placed on a heat plate or when it is put in the baking furnace 10a, the viscosity of the adhesive material gradually decreases. For example, when the temperature gradually increases from normal temperature to 40° C., 50°, or the like, the viscosity of the epoxy resin used as an adhesive material also gradually decreases. The viscosity reaches the minimum at around from 40° C. to 50° C. The bonding material having such a reduced viscosity tends to cause a bleed (oozing) 20 as shown in FIG. 22.

In the tape substrate 2 (multiple tape substrate 3) according to the present embodiment, when the bleed 20 is likely to occur by cure baking, a capillary action is positively caused and the bleed 20 can be allowed to run positively along the first region 2f, because the average distance between local peaks of the surface roughness in the first region 2f (first pattern 2j, second pattern 2k) between the land pad 2e and the semiconductor chip 1 shown in FIG. 17 is small (fine).

This makes it possible to prevent the bleed 20 from extending (attaching) to the wire bonding land pad 2e in the vicinity of the semiconductor chip 1 (to prevent the bleed 20 from encroaching the land pad 2e).

When the temperature reaches about 100° C., a curing reaction of the adhesive material starts. This means that the viscosity increases and curing starts. As a result, wetting and spreading are disturbed.

Since the mechanism of the bleed 20 is similar to that of surface tension or capillary action even at the normal temperature (room temperature), the bleed (oozing) 20 occurs inevitably after long hours. For example, if the substrate (a portion Q in FIG. 19) is waited for long hours upstream of the baking furnace 10a when it is put in the baking furnace 10a, there is a high possibility of the bleed (oozing) 20 being caused.

In the tape substrate 2 (multiple tape substrate 3) according to the present embodiment, however, the average distance between local peaks of the surface roughness in the first region 2f (first pattern 2j, second pattern 2k) between the land pad 2e and the semiconductor chip 1 is small (fine) so that by causing a capillary action (surface tension), the bleed 20 can be allowed to run positively along the first region 2f.

As a result, penetration of the bleed 20 in the wire bonding land pad 2 in the vicinity of the semiconductor chip 1 can be prevented.

Figure 20:
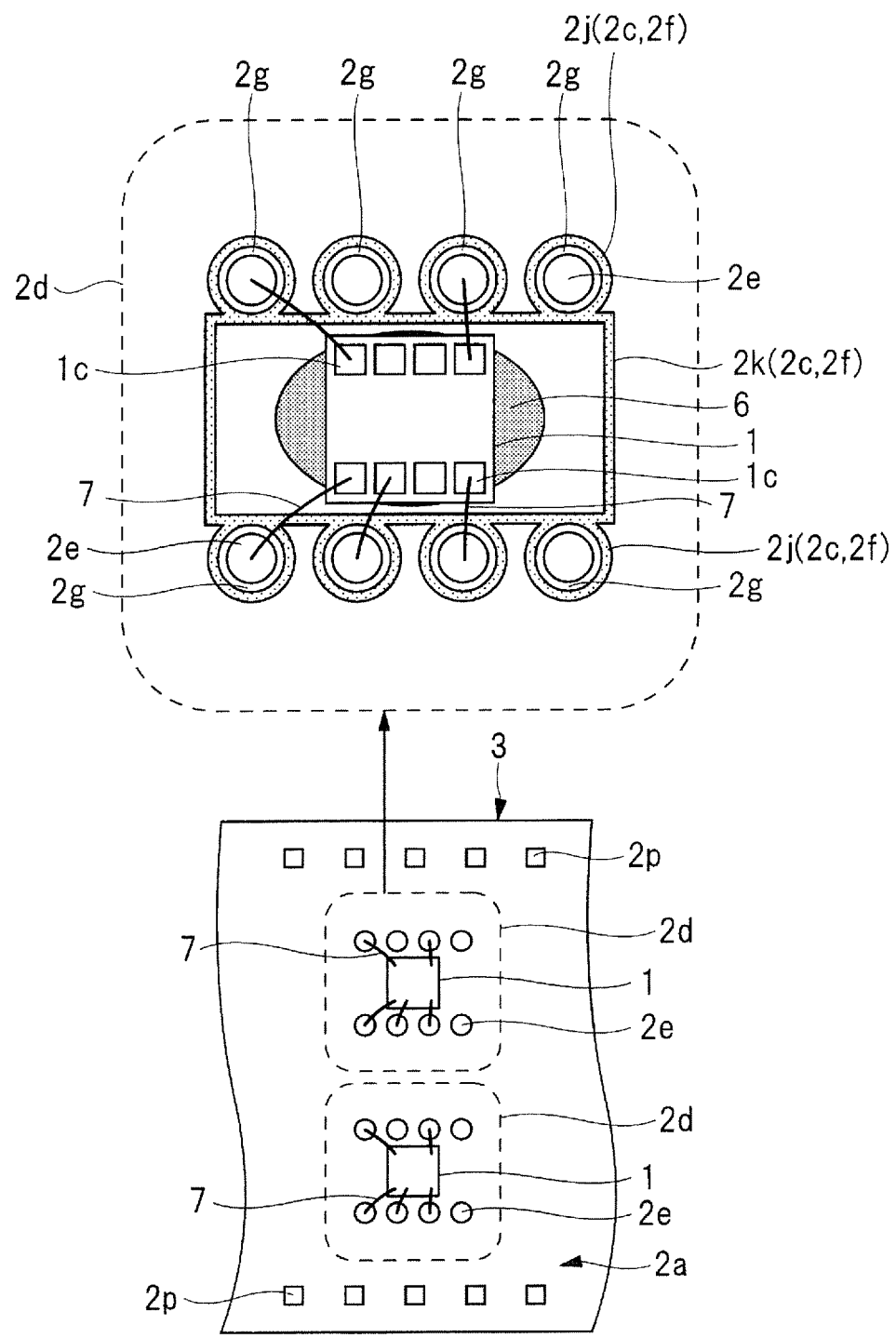
FIG. 20 includes an enlarged plan view and a partial plan view showing an example of a wire bonded state in the main steps of FIG. 14.

After completion of cure baking, wire bonding is conducted as shown in Step S7 of FIG. 13, Step S7 of FIG. 14, and the enlarged view and the plan view of FIG. 20. Described specifically, a plurality of electrode pads 1c placed on the surface 1a of the semiconductor chip 1 and the plurality of land pads 2e of the plurality of land patterns 2c are electrically coupled to each other with a plurality of wires 7. The wires 7 are, for example, gold wires or copper wires.

Then, a quality test shown in Step S8 of FIG. 13 is conducted. In this test, the coupled state and the like of the plurality of wires 7 achieved by wire bonding is inspected.

Resin molding as shown as Step S9 of FIG. 13 or Step S9 of FIG. 14 or as shown in FIG. 21 is then conducted. In this step, a portion of the multiple tape substrate 3 and the semiconductor chip 1 and the plurality of wires 7 as shown in FIG. 1 are molded with the molding body 4.

After completion of the resin molding, a quality test of Step S10 of FIG. 13 is conducted. In this step, the quality test of the molding body 4 is conducted.

Then, baking of Step S11 is conducted, followed by back surface appearance inspection of Step 12. In this step, the appearance inspection of the terminal portion 5 on the back surface is conducted.

Marking of Step 13 is then conducted. In this step, the surface of the molding body 4 is marked by using laser or the like.

Surface appearance inspection of Step S14 is then conducted. In this step, the external appearance of the surface of the molding body 4 is inspected.

Then, an electric property test (electric property selection) shown in Step S15 and shipping inspection shown in Step S16 are conducted, followed by packing in Step S17. After packing, it is shipped.

The occurrence mechanism of the bleed 20 and measures taken against it in the present embodiment will be described in detail.

As shown in Comparative Example of FIG. 23, the bleed (bleeding) 20 is a phenomenon of oozing of a low molecular component separated from a high molecular component of the die bond material (die bonding material) 6 that is composed of the high molecular component and the low molecular component. It has a property of spreading while wetting an object through a capillary action. Further, wetting and spreading of the bleed 20 is accelerated by applying heat to the die bond material 6 in the curing step prior to initiation of the curing action.

The bleed described herein is therefore completely different from the flow-out of an adhesive material in paste form applied in excess amount as a die bond material. If the adhesive material in paste form becomes excessive and flows out, the flow-out of it can be prevented by forming a groove or a bank. The bleed 20 is an oozing phenomenon so that it occurs independently whether the amount of the adhesive material itself is excessive or not. It is therefore difficult to prevent running of the bleed 20 by forming a groove or a bank.

Whether the bleed 20 runs easily or not depends on the surface roughness of a member in which the bleed 20 penetrates or a degree of binding force with the member in which the bleed penetrates.

In the tape substrate 2 employed in the present embodiment, as shown in FIG. 4, the average distance between local peaks of the surface roughness in the first region 2f between the wire bonding land pad 2e and the semiconductor chip 1 is smaller than the average distance between local peaks of the surface roughness in the second region 2g between the land pad 2e and the first region 2f.

By decreasing the average distance between local peaks of the surface, a large number of small concave portions (or convex portions) is formed on the surface with a fine pitch. The bleed is positively allowed to run through these concave portions by making use of a capillary action. As shown in an example of FIG. 22, the first region 2f is formed at least between the semiconductor chip and the land pad 2e and a pathway extending therefrom and permitting the bleed 20 to run so as not to climb up the land pad 2e is formed in the first region 2f. Thus, the bleed 20 is positively allowed to run through the pathway (first region 2f) to prevent it to encroach on the land pad 2e.

When all the content of the low molecular component in the die bond material 6 bleeds, no further bleed 20 occurs. It is therefore possible to stop the bleed 20 within the first region 2f by increasing the distance of the first region 2f so as to surround each of the land pads 2e and the semiconductor chip 1.

From the standpoint of the binding force with the bleed 20, the bleed 20 can be allowed to run more smoothly by selecting, when the die bond material 6 is made of a resin, a material (for example, a metal) having no affinity with the resin. This means that it is preferred to select a material which does not easily bond to the resin and place it on the surface of the first region 2f. For example, coating of the surface of the first region 2f in Au plating 2h as shown in FIG. 11 is preferred. Alternatively, an insulating film such as resist film 2i may be formed on the surface of the first region 2f.

From the standpoint of suppressing the bleed 20 itself, on the other hand, adjustment of the viscosity of the die bond material 6 is effective. The die bond material 6 having a high viscosity becomes inferior in wettability and spreadability to the back surface 1b of the semiconductor chip 1. A low molecular component is therefore added to adjust the viscosity. An increase in the amount of the low molecular component however reduces the viscosity of the bonding material. As a result, the bleed 20 easily occurs. The viscosity of the die bond material 6 is therefore adjusted by incorporating therein a solvent, reactive diluent, or the like to secure wettability and spreadability of the die bond material 6 during die bonding.

In the present embodiment, since the average distance of local peaks of the surface roughness of the first region 2f between the land pad 2e of the tape substrate 2 and the semiconductor chip 1 is smaller than the average distance of local peaks of the surface roughness of the second region 2g between the land pad 2e and the first region 2f, a greater number of irregularities is formed on the surface with a finer pitch in the first region 2f than in the second region 2g.

As a result, even if the low molecular component bleeds (oozes out) from the die bond material 6 of the semiconductor chip 1 by heat treatment, the bleed 20 can be allowed to positively run along the first region 2f with a capillary action due to fine irregularities of the surface of the first region 2f.

This makes it possible to prevent the bleed 20 from climbing up to the wire bonding land pad 2e in the vicinity of the semiconductor chip 1 (prevent the bleed 20 from encroaching the land pad 2e).

It is therefore possible to reduce or prevent occurrence of bonding failures in wire bonding and thereby provide a semiconductor device (COT8) having an improved quality.

Other modification examples according to the present embodiment will next be described.

Figure 24:
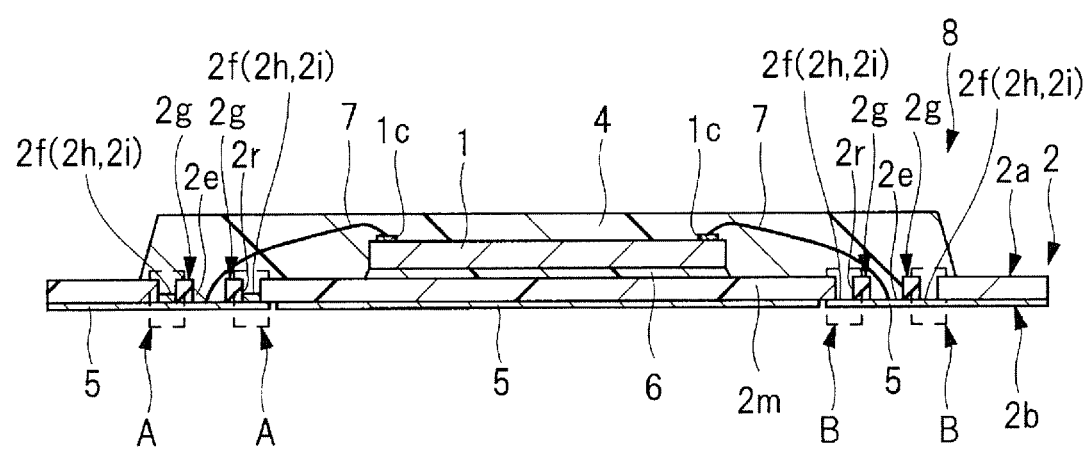
FIG. 24 is a cross-sectional view showing the structure of a semiconductor device according to an eighth modification example of the embodiment.
Figure 25:
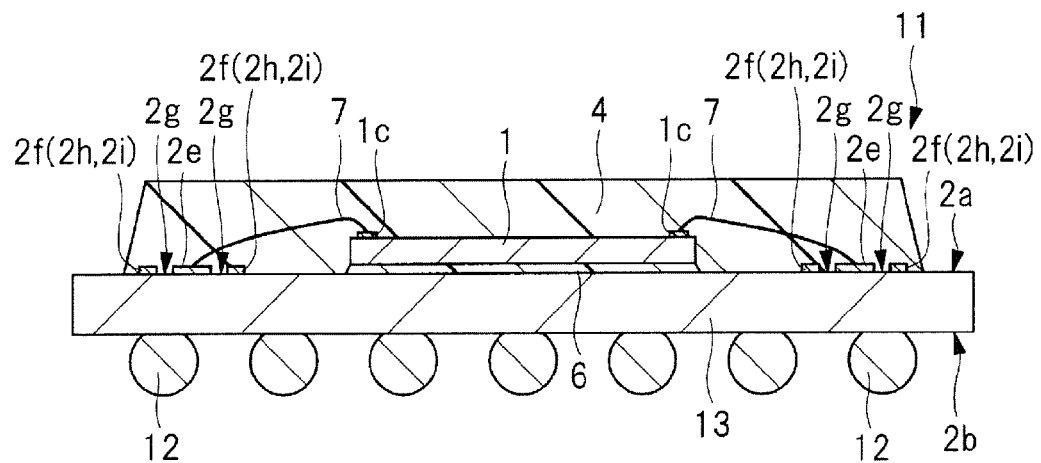
FIG. 25 is a cross-sectional view showing the structure of a semiconductor device according to a ninth modification example of the embodiment.

FIG. 24 is a cross-sectional view showing the structure of a semiconductor device according to an eighth modification example of the embodiment; and FIG. 25 is a cross-sectional view showing the structure of a semiconductor device according to a ninth modification example of the embodiment.

In the eighth example shown in FIG. 24, the first region 2f of the tape substrate 2 is formed as a recess (groove portion 2r) at a position lower than the chip mounting surface (upper surface 2a) of the tap substrate 2. By forming the first region 2f as a recess (groove portion 2r), the oozing velocity of the bleed 20 can be suppressed.

At this time, the surface of the first region 2f may be an insulating resist film 2i as shown in the portion A of FIG. 24 or the upper surface side of the terminal portion 5 may be used as shown in the portion B. The terminal portion 5 is a Cu foil plated with (Ni—Au) so that it has a weak bonding force with a resin, which makes it possible to accelerate running of the bleed 20.

The ninth modification example shown in FIG. 25 is an application example of the wiring board of the present embodiment to a rigid substrate (substrate using an insulating base material with less flexibility). The wiring board of the present embodiment is not limited to the tape substrate 2, but can be applied to a hard rigid substrate. FIG. 25 shows a BGA (ball grid array) 11 having the semiconductor chip 1 on a package substrate 13, which is a rigid substrate, via the die bond material 6 and at the same time having a plurality of solder balls 12 as an external terminal on the back surface side of the package substrate 13. In the BGA11, the land pads 2e on the side of the upper surface 2a of the package substrate 13 and the solder balls 12 on the side of the lower surface 2b are electrically coupled to each other.

This means that the semiconductor device according to the present embodiment may be a BGA11 having a package substrate (wiring board, rigid substrate) 13 as shown in FIG. 25 or LGA (land grid array), or the like.

The invention made by the present inventors has so far been described specifically based on some embodiments. It should however be borne in mind that the present invention is not limited to or by these embodiments but can be changed in various ways without departing from the gist of the invention.

For example, in the above embodiments, the description has been made using, as an example of the adhesive material (die bond material 6), a material having an epoxy resin as a main component, but the adhesive material is not limited to an epoxy-based adhesive material and but may be an acrylic adhesive material, polyimide-based adhesive material, or the like. The main characteristics described in the above-mentioned embodiment can be applied if the adhesive material causes a bleeding phenomenon.

What is claimed is:

1. A method of manufacturing a semiconductor device, comprising the steps of:
    (a) providing a wiring board having a first main surface over which a plurality of land patterns has been formed;
    (b) mounting a semiconductor chip over the first main surface of the wiring board via an adhesive material;
    (c) curing the adhesive material at a temperature higher than a normal temperature;
    (d) electrically coupling a plurality of pads placed over the surface of the semiconductor chip to a plurality of land pads in the land patterns by using a plurality of metal wires, respectively; and
    (e) molding a portion of the wiring board, the semiconductor chip, and the metal wires with a molding body,
    wherein in a planar view, an average distance between local peaks of the surface roughness of a first region between each of the land pads of the wiring board and the semiconductor chip is smaller than an average distance between local peaks of the surface roughness of a second region between each of the land pads of the wiring board and the first region.

2. The method of manufacturing a semiconductor device according to claim 1,
    wherein the surface of the semiconductor chip is substantially a quadrangle and a first side of the surface extends in a first direction,
    wherein the land pads of the wiring board are, in a planar view, placed opposite to the first side of the semiconductor chip along the first direction, and
    wherein the length of the first region in the first direction is greater than the length of each of the land pads in the first direction.

3. The method of manufacturing a semiconductor device according to claim 2,
    wherein the first region is, in a planar view, placed so as to surround a portion of the periphery of each of the land pads.

4. The method of manufacturing a semiconductor device according to claim 3,
    wherein the first region is, in a planar view, placed so as to surround the entire periphery of each of the land pads.

5. The method of manufacturing a semiconductor device according to claim 2,
    wherein the first region is, in a planar view, placed so as to surround the periphery of the semiconductor chip.

6. The method of manufacturing a semiconductor device according to claim 1,
    wherein the surface of the first region is coated in Au plating.

7. The method of manufacturing a semiconductor device according to claim 6,
    wherein the second region has, over the surface thereof, an insulating film.

8. A method of manufacturing a semiconductor device, comprising the steps of:
    (a) providing a wiring board having a first main surface over which a plurality of land patterns has been formed;
    (b) mounting a semiconductor chip over the first main surface of the wiring board via an adhesive material;
    (c) curing the adhesive material at a temperature higher than a normal temperature;
    (d) electrically coupling a plurality of pads placed over the surface of the semiconductor chip to a plurality of land pads in the land patterns by using a plurality of metal wires, respectively; and
    (e) molding a portion of the wiring board, the semiconductor chip, and the metal wires with a molding body, wherein
    in a planar view, an average distance between local peaks of the surface roughness of a first region between each of the land pads of the wiring board and the semiconductor chip is smaller than an average distance between local peaks of the surface roughness of a second region between each of the land pads of the wiring board and the first region, and
    the height of the surface of the first region is greater than the height of the surface of the second region.

9. The method of manufacturing a semiconductor device according to claim 1,
    wherein the height of the surface of the first region is lower than the height of the surface of the second region.

10. The method of manufacturing a semiconductor device according to claim 1,
    wherein the adhesive material has an epoxy resin as a main component.

11. The method of manufacturing a semiconductor device according to claim 1,
    wherein the wiring board has a second main surface which is on the side opposite to the first main surface and has a plurality of external terminals, and
    wherein the external terminals and the land pads are electrically coupled to each other, respectively.

12. The method of manufacturing a semiconductor device according to claim 1,
    wherein the first region is, in a planar view, a portion of a first pattern formed to surround the periphery of each of the land pads.

13. The method of manufacturing a semiconductor device according to claim 1,
    wherein the first region is, in a planar view, a portion of a second pattern formed to surround the periphery of the semiconductor chip.

14. The method of manufacturing a semiconductor device according to claim 1,
    wherein the adhesive material has a low molecular component.

* * * * *